(12) United States Patent
Ono

(10) Patent No.: US 8,922,228 B2
(45) Date of Patent: Dec. 30, 2014

(54) CONTROL METHOD AND A CONTROL APPARATUS IN A HYBRID TYPE CONSTRUCTION APPARATUS

(75) Inventor: Tetsuji Ono, Kanagawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 215 days.

(21) Appl. No.: 13/395,475

(22) PCT Filed: Sep. 14, 2010

(86) PCT No.: PCT/JP2010/065853
§ 371 (c)(1),
(2), (4) Date: Mar. 12, 2012

(87) PCT Pub. No.: WO2011/034060
PCT Pub. Date: Mar. 24, 2011

(65) Prior Publication Data
US 2012/0169358 A1     Jul. 5, 2012

(30) Foreign Application Priority Data

Sep. 15, 2009 (JP) ................................. 2009-213641

(51) Int. Cl.
*G01R 27/14* (2006.01)
*B60W 20/00* (2006.01)
*H01M 10/48* (2006.01)
*B60W 10/08* (2006.01)
*G01R 31/36* (2006.01)

(52) U.S. Cl.
CPC .............. *H01M 10/48* (2013.01); *B60W 10/08* (2013.01); *G01R 31/3662* (2013.01); *B60W 20/00* (2013.01); *B60W 2510/244* (2013.01); *B60W 2710/086* (2013.01); *Y10S 903/902* (2013.01)
USPC .......... 324/720; 477/21; 903/902; 180/65.27; 701/22

(58) Field of Classification Search
CPC .. G01R 31/3662; B60W 10/48; B60W 20/00; B60W 2710/086; B60W 2510/244
See application file for complete search history.

(56) References Cited

U.S. PATENT DOCUMENTS 8,239,081 B2 * 8/2012 Sugiyama ...................... 701/22
8,571,735 B2 * 10/2013 Koga et al. ..................... 701/22
(Continued)

FOREIGN PATENT DOCUMENTS

| JP | 09-230010 | 9/1997 |
| JP | 2003-224902 | 8/2003 |

(Continued)

OTHER PUBLICATIONS

Translation of JP2007-155568A filed Jun. 21, 2007.*
Translation of JP2005-341760A filed on Dec. 8, 2005.*
International Search Report mailed on Nov. 9, 2010.

*Primary Examiner* — Jermele M Hollington
(74) *Attorney, Agent, or Firm* — IPUSA, PLLC

(57) ABSTRACT

A control method of measuring an internal resistance of an electric power accumulator 19 of a hybrid-type construction machine 100 comprises: a pattern generating step of generating an internal resistance measurement pattern in a non-operation status in which there is no operation for the hybrid-type construction machine from an operator; an output changing step of changing an output of a generator 12 based on the pattern generated in the pattern generating step in the non-operation status; an electric current, etc., detecting step of detecting electric current values and voltage values in the electric power accumulator 19 before and after the change of the output of the generator 12 in the output changing step; and an internal resistance measuring step of measuring the internal resistance of the electric power accumulator 19 based on the electric current values and the voltage values detected before and after the change of the output of the generator 12 in the electric current, etc., detecting step.

17 Claims, 16 Drawing Sheets

(56) References Cited

U.S. PATENT DOCUMENTS

| | | | |
|---|---|---|---|
| 8,676,452 B2 * | 3/2014 | Kawashima et al. | 701/50 |
| 8,739,906 B2 * | 6/2014 | Kawashima | 180/65.22 |
| 8,844,660 B2 * | 9/2014 | Kawashima et al. | 180/65.29 |
| 2006/0066285 A1 | 3/2006 | Minamiura | |
| 2010/0228416 A1 | 9/2010 | Sugiyama | |
| 2011/0251746 A1 * | 10/2011 | Wu et al. | 701/22 |
| 2011/0270481 A1 * | 11/2011 | Koga et al. | 701/22 |
| 2012/0167561 A1 * | 7/2012 | Ono et al. | 60/486 |
| 2012/0187756 A1 * | 7/2012 | Yanagisawa | 307/9.1 |

FOREIGN PATENT DOCUMENTS

| | | |
|---|---|---|
| JP | 2004-320923 | 11/2004 |
| JP | 2005-341760 | 12/2005 |
| JP | 2006-126172 | 5/2006 |
| JP | 2007-155586 | 6/2007 |
| JP | 2007-240178 | 9/2007 |
| JP | 2009-294102 | 12/2009 |
| JP | 2009-300318 | 12/2009 |
| JP | 2011-130653 | 6/2011 |

\* cited by examiner

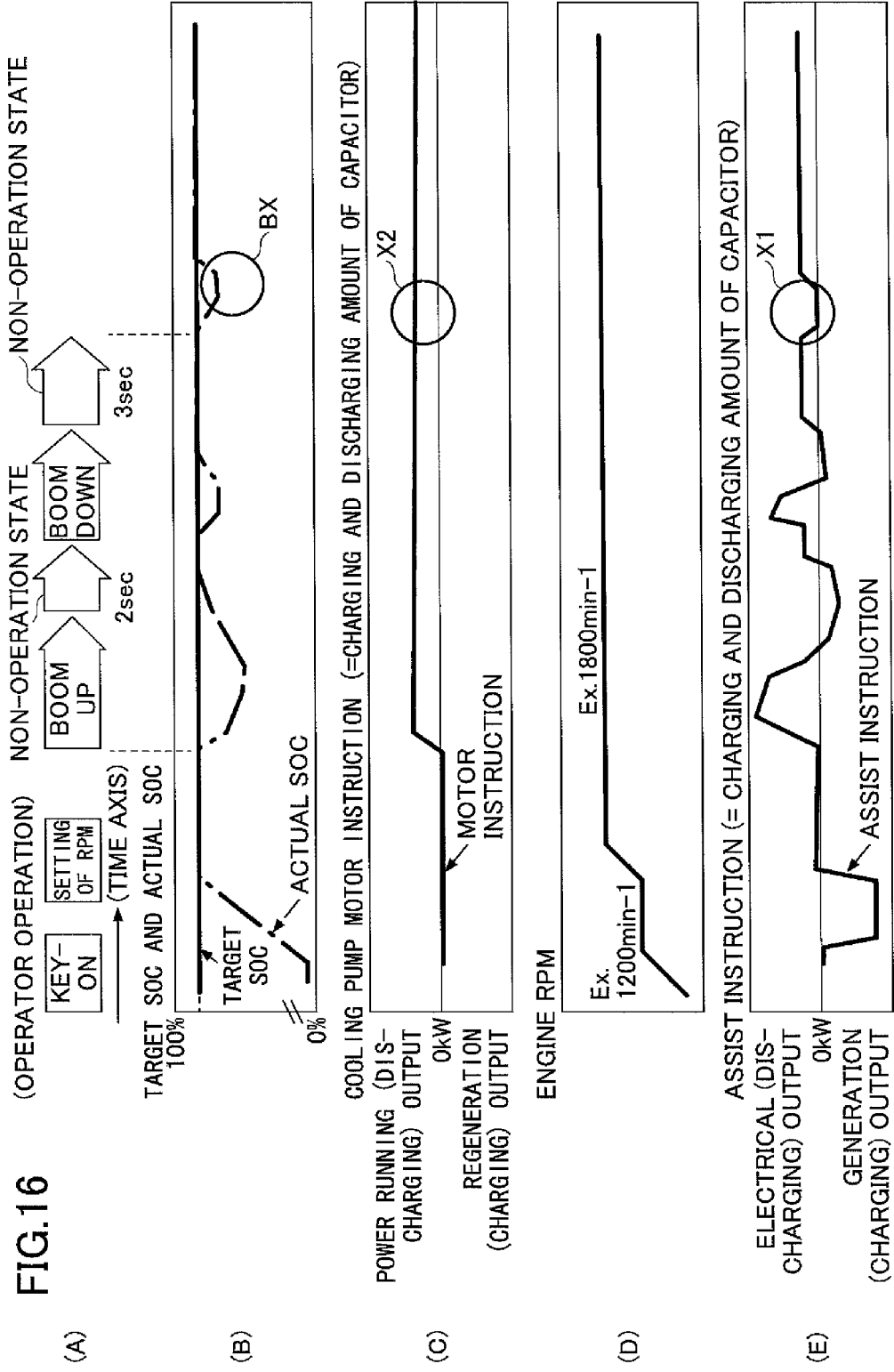

CONTROL METHOD AND A CONTROL APPARATUS IN A HYBRID TYPE CONSTRUCTION APPARATUS

TECHNICAL FIELD

The present invention is related to a control method and a control apparatus in a hybrid-type construction machine.

BACKGROUND ART

JP 2003-224902 A discloses a method of diagnosing performance of capacitors for a vehicle in an electric motor system for a vehicle which utilizes energy accumulated in capacitors provided on the vehicle, wherein charging current for the capacitors for a vehicle is measured based on voltage values of precise resistances, and capacitances or internal resistances of the capacitors are measured based on charging current after a startup of the system and initial changes of the voltages of the capacitors.

JP 2006-126172 A discloses a method of detecting a status of a secondary battery comprising: a step of obtaining data of pairs of electric currents passing through the secondary battery and a terminal voltage of the secondary battery associated with the electric current; a step of performing statistical processing for the data of the pairs effective at the time of charging and discharging to calculate an internal resistance value at the time of charging and discharging of the secondary battery based on a gradient of an approximate line obtained by the statistical processing; a step of performing statistical processing for the data of the pairs effective at the time of charging to calculate an internal resistance value at the time of charging of the secondary battery based on a gradient of an approximate line obtained by the statistical processing; and a step of calculating the internal resistance value of the secondary battery based on the internal resistance value at the time of charging and discharging and the internal resistance value at the time of charging.

In order to precisely measure an internal resistance of an electric power accumulator, it is desired to use electric current values and voltage values before and after a change from a state in which there is substantially no charging or discharging in the electric power accumulator to a state in which the charging or the discharging is performed.

SUMMARY OF INVENTION

Therefore, an object of the present invention is to provide a control method and a control apparatus which can obtain electric current values and voltage values before and after a change from a state in which there is substantially no charging or discharging in an electric power accumulator to a state in which the charging or the discharging is performed, thereby precisely measuring an internal resistance of the electric power accumulator.

According to an aspect of the present invention, a control method of measuring an internal resistance of an electric power accumulator of a hybrid-type construction machine including an engine, a generator, the electric power accumulator, and a driven part driven using electric power from the electric power accumulator is provided which comprises;

a pattern generating step of generating an internal resistance measurement pattern in a non-operation status in which there is no operation for the hybrid-type construction machine from an operator;

an output changing step of changing an output of the generator based on the pattern generated in the pattern generating step in the non-operation status;

an electric current, etc., detecting step of detecting electric current values and voltage values in the electric power accumulator before and after the change of the output of the generator in the output changing step; and an internal resistance measuring step of measuring the internal resistance of the electric power accumulator based on the electric current values and the voltage values detected before and after the change of the output of the generator in the electric current, etc., detecting step.

According to the present invention, a control method and a control apparatus are obtained which can obtain electric current values and voltage values before and after a change from a state in which there is substantially no charging or discharging in an electric power accumulator to a state in which the charging or the discharging is performed, thereby precisely measuring an internal resistance of the electric power accumulator.

BRIEF DESCRIPTION OF DRAWINGS

FIG. 16 is a diagram for illustrating a wave shapes related to a configuration in which the internal resistance is measured using the cooling pump motor.

Figure 1:
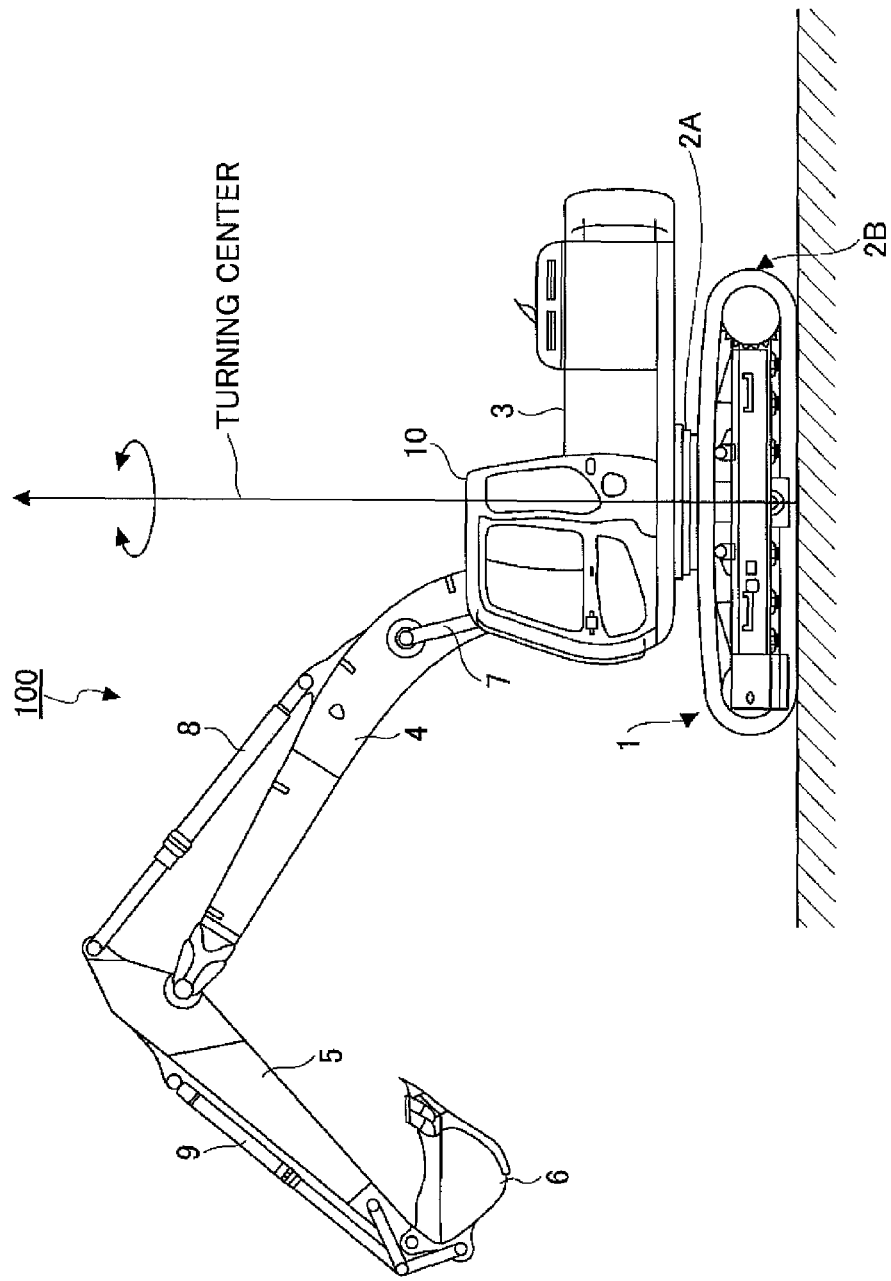
FIG. 1 is a side view of a hybrid-type construction machine 100 according to an embodiment of the present invention.

EXPLANATION FOR REFERENCE NUMBERS 1 lower-part traveling body
1A, 1B hydraulic motor
2A turning mechanism
2B traveling mechanism
3 upper-part turning body
4 boom
5 arm
6 bucket
7 boom cylinder
8 arm cylinder
9 bucket cylinder
10 cabin
11 engine
12 motor generator
13 transmission
14 main pump
15 pilot pump
16 high pressure oil line
17 control valve
18 inverter
19 capacitor
20 inverter
21 turning electric motor
22 resolver
23 mechanical brake
24 turning reduction gear
25 pilot line
26 operation device
26A, 26B lever
26C pedal
27 oil pressure line
28 oil pressure line
29 pressure sensor
30 controller
72 electric current sensor
74 voltage meter
100 hybrid-type construction machine Best Mode for Carrying out the Invention In the following, the best mode for carrying out the present invention will be described in detail by referring to the accompanying drawings.

FIG. 1 is a side view of a hybrid-type construction machine 100 according to an embodiment of the present invention.

An upper-part turning body 3 is mounted on a lower-part traveling body 1 of the hybrid-type construction machine 100 via a turning mechanism 2A. Further, on the upper-part turning body 3 are mounted a boom 4, an arm 5, a bucket 6, a boom cylinder 7, an arm cylinder 8, a bucket cylinder 9, the cylinder being for hydraulically driving these members, a cabin 10 and a power source.

Figure 2:
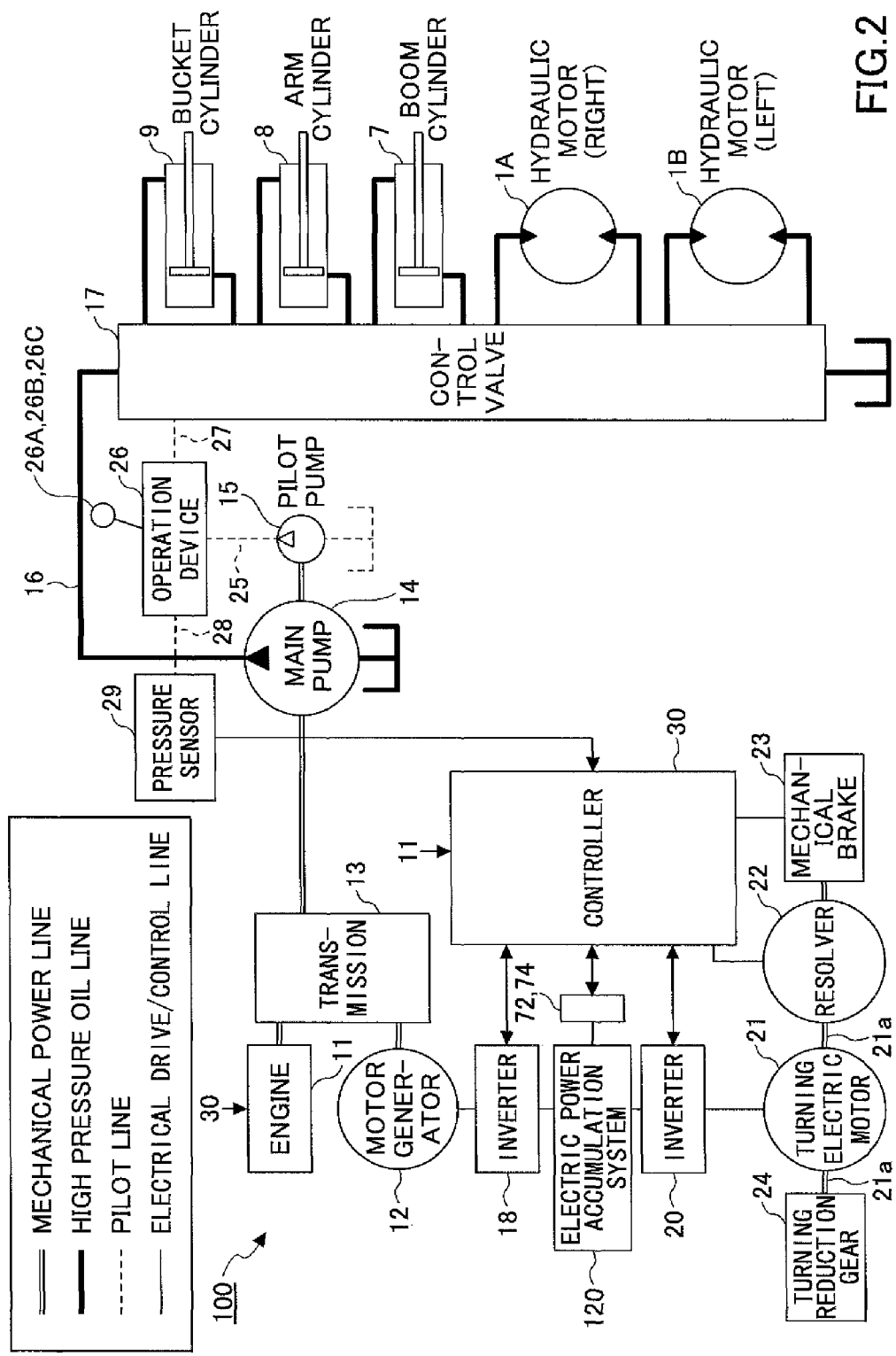
FIG. 2 is a block diagram for illustrating a main configuration of the hybrid-type construction machine 100.

FIG. 2 is a block diagram for illustrating a main configuration of the hybrid-type construction machine 100 including a control device. In FIG. 2, connections related to mechanical power are indicated by double lines, high pressure oil lines are indicated by solid lines, pilot lines are indicated by broken lines, and connections related to electrical drive or control are indicated by alternating long and short dashed lines.

An engine 11 and a motor generator 12 are connected to an input shaft of a transmission 13. Further, a main pump 14 and a pilot pump 15 are connected to an output shaft of the transmission 13. The main pump 14 is connected to a control valve 17 via a high pressure oil line 16.

The control valve 17 controls a hydraulic system in the hybrid-type construction machine 100. To the control valve 17 are connected hydraulic motors 1A (for right side) and 15 (for left side) for the lower-part traveling body 1, the boom cylinder 7, the arm cylinder 8 and the bucket cylinder 9 via the high pressure line.

A capacitor 19 is connected to the motor generator 12 via an inverter 18. A turning electric motor 21 is connected to the capacitor 19 via an inverter 20.

To a rotating shaft 21a of the turning electric motor 21 are connected a resolver 22, a mechanical brake 23 and a turning reduction gear 24. An operation device 26 is connected to a pilot pump 15 via a pilot line 25.

To the operation device 26 are connected the control valve 17 and a pressure sensor 29 via oil pressure lines 27 and 28, respectively. To the pressure sensor 29 is connected a controller 30 for controlling an electrical system of the hybrid-type construction machine 100.

The hybrid-type construction machine 100 is powered by the engine 11, the motor generator 12 and the turning electric motor 21. These power sources are mounted on the upper-part turning body 3 illustrated in FIG. 1. The respective parts are described below.

The engine 11 is a diesel engine, for example. The output shaft of the engine 11 is connected to one of the input shafts of the transmission 13. The engine 11 is constantly operated during an operation of the hybrid-type construction machine 100.

The motor generator 12 may be any motor which can perform power running and regeneration. Here, the motor generator 12 is a motor generator which is driven with AC voltage by the inverter 18. The motor generator 12 may be an IMP (Interior Permanent Magnetic) motor in which magnets are buried inside a rotor. The rotating shaft of the motor generator 12 is connected to another input shaft of the transmission 13.

The transmission 13 has two input shafts and an output shaft. The input shafts are connected to a driving shaft of the engine 11 and a driving shaft of the motor generator 12, respectively. Further, the output shaft is connected to a driving shaft of the main pump 14. If a load on the engine 11 is great, the motor generator 12 performs power running and a driving force is transmitted to the main pump 14 via the output shaft of the transmission 13. In this way, the driving of the engine 11 is assisted. On the other hand, if the load on the engine 11 is small, the motor generator 12 performs regeneration as the driving force of the engine 11 is transmitted to the motor generator 12 via the transmission 13. The switching between the power running and the regeneration of the motor generator 12 is performed by the controller 30 according to the load of the engine 11, etc.

The main pump 14 generates oil pressure which is to be supplied to the control valve 17. The oil pressure is supplied to the hydraulic motors 1A and 1B, the boom cylinder 7, the arm cylinder 8 and the bucket cylinder 9 via the control valve 17 to drive these items.

The pilot pump 17 generates pilot pressure required for a hydraulic operating system. The configuration of the hydraulic operating system is described later.

The control valve 17 hydraulically controls the hydraulic motors 1A and 1B for the lower-part traveling body 1, the boom cylinder 7, the arm cylinder 8 and the bucket cylinder 9 connected thereto via the high pressure line by controlling the oil pressures to be supplied to these items according to operation inputs from an operator.

The inverter 18 is provided between the motor generator 12 and the capacitor 19, as described above. The inverter 18 controls operations of the motor generator 12 based on instructions from the controller 30. When the inverter 18 controls the power running of the motor generator 12, required electric power is supplied to the motor generator 12 from the capacitor 19. Further, when the inverter 18 controls the regeneration of the motor generator 12, the capacitor 19 is charged with electric power generated by the motor generator 12.

An electric power accumulation system 120 includes the capacitor 19 (see FIG. 3) and is provided between the inverter 18 and the inverter 20. When at least one of the motor generator 12 and the turning electric motor 21 performs the power running, the electric power accumulation system 120 supplies the electric power required for the power running. Further, when at least one of the motor generator 12 and the turning electric motor 21 performs the regeneration, the electric power accumulation system 120 accumulates the electric power regenerated by the regeneration as electric energy. It is noted that the capacitor 19 may be an electric double layer capacitor. Instead of the capacitor 19, a battery such as a lead acid battery, a nickel-hydrogen battery, a lithium ion battery, etc., may be used.

The inverter 20 is provided between the turning electric motor 21 and the capacitor 19, as described above. The inverter 20 controls operations of the turning electric motor 21 based on instructions from the controller 30. When the inverter 20 controls the power running of the turning electric motor 21, required electric power is supplied to the turning electric motor 21 from the capacitor 19. Further, when the inverter 18 controls the regeneration of the turning electric motor 21, the capacitor 19 is charged with electric power generated by the turning electric motor 21.

The turning electric motor 21 can perform power running and regeneration and is PWM (Pulse Width Modulation) driven by the inverter 20. Preferably, the turning electric motor 21 is an IMP motor in which magnets are buried inside a rotor. The turning electric motor 21 is provided for driving the turning mechanism 2A of the upper-part turning body 3. At the time of power running, torque of a rotational driving force of the turning electric motor 21 is amplified by the turning reduction gear 24, and the upper-part turning body 3 is controlled to accelerate or decelerate its rotating motion. Further, because of rotational inertia of the upper-part turning body 3, the number of revolutions of the turning electric motor 21 is increased by the turning reduction gear 24 to be transmitted to the turning electric motor 21, and thus regenerative electric power can be generated.

Control of charging and discharging of the capacitor 19 is performed by the controller 30 based on a state of charge (SOC) of the capacitor 19, a running state (engine rpm) of the engine 30, a running state (electric motor mode or generator mode) of the motor generator 12, a running state (power running or regenerator mode) of the turning electric motor 21, etc.

The resolver 22 is a sensor for detecting a rotational position and a rotation angle of the rotating shaft 21a of the turning electric motor 21. The resolver 22 is mechanically connected to the turning electric motor 21 and is configured to detect a difference between a rotational position before the rotation of the turning electric motor 21 and a rotational position after the rotation in a left or right direction in order to detect the rotational angle and a rotation direction of the rotating shaft 21a. The rotational angle and a rotation direction of the turning mechanism 2A is derived by detecting the rotational angle of the rotating shaft 21a of the turning electric motor 21.

The mechanical brake 23 generates a mechanical braking force to mechanically stop the rotating shaft 21a of the turning electric motor 21. The mechanical brake 23 is switched between a braking position and a release position by a electro-magnetic switch. The switching is controlled by the controller 30.

The turning reduction gear 24 reduces the rotational speed of the rotating shaft 21a of the turning electric motor 21 and mechanically transmits it to the turning mechanism 2A. In this way, at the time of power running, torque of the turning electric motor 21 is increased, thereby increased torque can be transmitted to the turning body. To the contrary, at the time of the regeneration, the number of revolutions generated in the turning body is increased, thereby more rotational operations can be generated in the turning electric motor 21.

The turning mechanism 2A can turn in a state where the mechanical brake 23 of the turning electric motor 21 is released, and thus the upper-part turning body 3 is turned in left and right directions.

The operation device 26 is provided for operating the turning electric motor 21, the lower-part traveling body 1, the boom 4, the arm 5 and the bucket 6, and includes levers 26A and 26B and a pedal 26C. The lever 26A is provided for operating the turning electric motor 21 and the arm 5, and is located near a driver's seat in the upper-part turning body 3. The lever 26B is provided for operating the boom 4 and the bucket 6, and is located near the driver seat. Further, the pedal 26C is a pair of pedals for operating the lower-part traveling body 1, and located near a foot placing position at the driver seat.

The operation device 26 outputs an oil pressure (primary side) supplied via the pilot line 26 after converting it to an oil pressure (secondary side) according to the operation amount of the operator. The oil pressure on the secondary side output from the operation device 26 is supplied to the control valve 17 via the oil pressure line 27 and is detected by the pressure sensor 29.

When the levers 26A and 26B and the pedal 26C are operated, respectively, the control valve 17 is driven via the oil pressure line 27 so that the oil pressures in the hydraulic motors 1A, 1B, the boom cylinder 7, the arm cylinder 8 and the bucket cylinder are controlled and thus the lower-part traveling body 1, the boom 4, the arm 5 and the bucket 6 are driven.

It is noted that with respect to the oil pressure line 27, one is provided for operating the hydraulic motors 1A, 1B (i.e., total two), and two are provided for each of the boom cylinder 7, the arm cylinder 8 and the bucket cylinder 9, (i.e., total six), and thus a total eight oil pressure lines are provided; however, for the sake of convenience for the explanation, they are unified as an oil pressure line 27.

The pressure sensor 29 separately detects changes in oil pressure in the oil pressure line 28 due to the respective operations of the levers 26A and 26B and the pedal 26C. The pressure sensor 29 detects changes in the oil pressure for operating the turning electric motor 21, the boom 4, the arm 5, the bucket 6 and the lower-part traveling body 1 by the levers 26A and 26B and the pedal 26C and outputs electrical signals representing the oil pressures in the oil pressure line 28 due to the respective operations. The electrical signals are input to the controller 30.

An electric current sensor 72 for detecting electric current passing through the capacitor 19 (charging current/discharging current) and a voltage meter 74 for detecting a voltage across the capacitor are provided for the capacitor 19. An electric signal representing the electric current value detected by the electric current sensor 72 and an electric signal representing the voltage value detected by the voltage meter 74 are input to the controller 30.

The controller 30 is configured to include a calculation processing device including a CPU (Central Processing Unit) and an internal memory. The controller 30 performs a variety of controls for the hybrid-type construction machine 100. The controller 30 rotationally drives the turning electric motor 21 via the inverter 20 according to the operation amount of the lever 26A based on the electrical signal output from the pressure sensor 29, for example (see FIG. 4).

The controller 30 has a function of measuring an internal resistance of the capacitor 19 based on the electric current values and voltage values from the electric current sensor 72 and the voltage meter 74. A method of measuring the internal resistance of the capacitor 19 implemented by the controller 30 is described in detail. The function of measuring the internal resistance of the capacitor 19 may be implemented by a processing device other than the controller 30.

Figure 3:
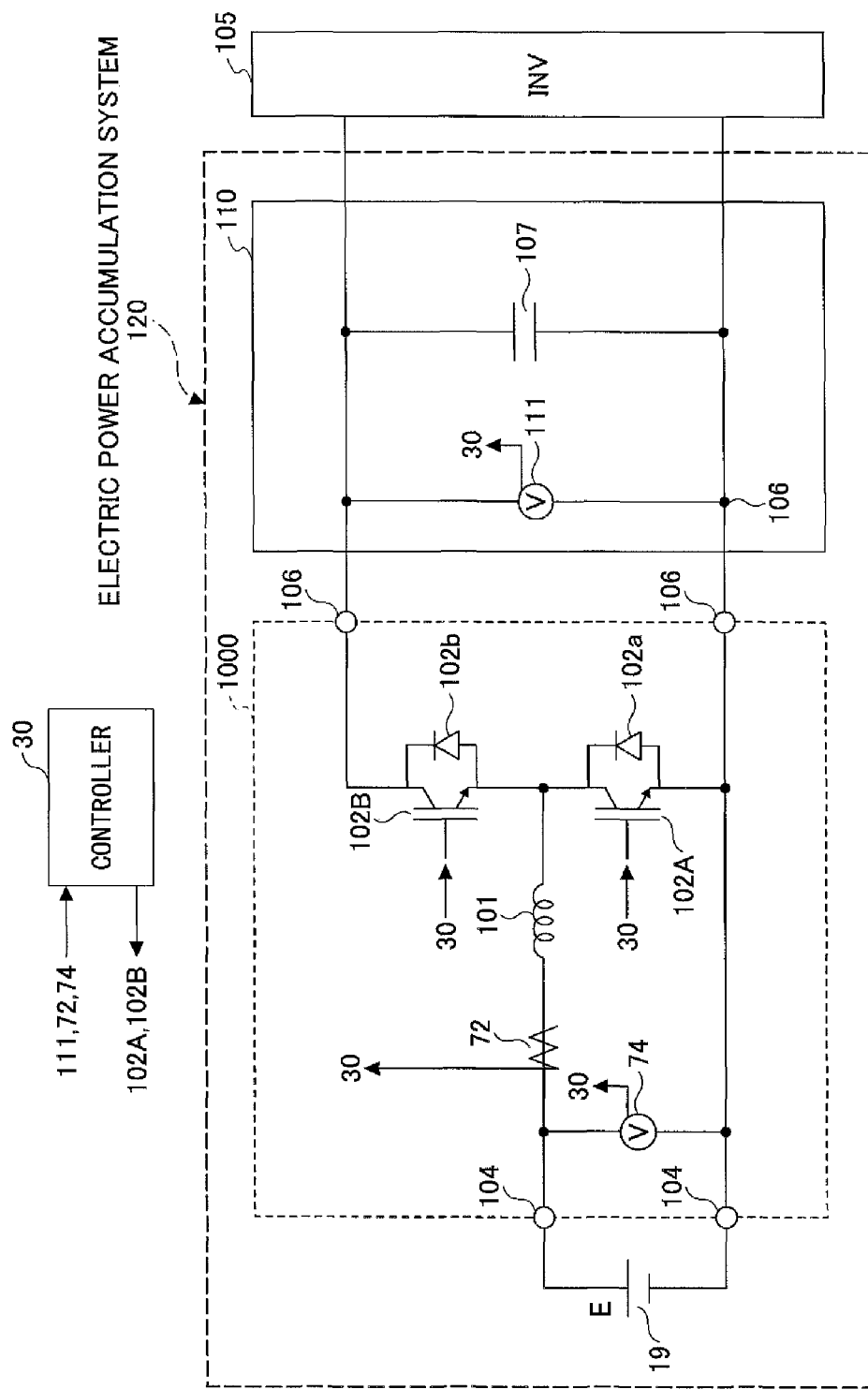
FIG. 3 is a diagram for illustrating a detail of a configuration relevant to a capacitor 19 (an electric power accumulation system 120) used in the hybrid-type construction machine 100.

FIG. 3 is a diagram for illustrating details of a configuration relevant to the capacitor 19 (the electric power accumulation system 120) used in the hybrid-type construction machine 100. A step-up and step-down transformer 1000 includes an inductor 101, an IGBT (Insulated Gate Bipolar Transistor) 102A for step-up transformation, an IGBT 102B for step-down transformation, power supply connector terminals 104 for connecting to the capacitor 19, output terminals 106 for connecting to the inverter 105, and a smoothing condenser 107 inserted between the output terminals 106. The output terminals 106 of the step-up and step-down transformer 1000 are connected to an inverter 105 via a DC bus 110. The inverter 105 corresponds to the inverter 18 and 20.

The inductor 101 has one end connected to a midpoint between the IGBT 102A for step-up transformation and the IGBT 102B for step-down transformation and another end connected to one of the power supply connector terminals 104. The inductor 101 is provided for supplying an induced electromotive force generated due to on/off operations of the IGBT 102A for step-up transformation to the DC bus 110.

The IGBT 102A for step-up transformation and the IGBT 102B for step-down transformation are formed of bipolar transistors which have MOSFETs (Metal Oxide Semiconductor Field Effect Transistors) incorporated in gate portions, and are capable of switching bulk power at high speed. The IGBT 102A for step-up transformation and the IGBT 102B for step-down transformation are driven with a PWM voltage applied to the respective gates by the controller 30. The IGBT 102A for step-up transformation and the IGBT 102B for step-down transformation are connected to diodes 102a and 102b, respectively, in parallel, which are rectifying elements.

The power supply connector terminals 104 and the output terminals 106 may be any terminals which can be connected to the capacitor 19 and the inverter 105. A capacitor voltage detecting part (corresponding to the voltage meter 74) for detecting a capacitor voltage is connected between the power supply connector terminals 104. A DC bus voltage detecting part 111 for detecting a DC bus voltage is connected between the output terminals 106.

The voltage meter 74 detects the voltage value of the capacitor 19 and the DC bus voltage detecting part 111 detects the voltage value of the DC bus 110. The smoothing condenser 107 is inserted between the positive terminal and the negative terminal of the output terminals 106. The smoothing condenser 107 may be any capacitor element which can smooth the DC bus voltage. The electric current sensor 72 may be any detector which can detect the value of the electric current passing through the capacitor 19, and includes a resistor for detecting the electric current. The electric current sensor 72 detects, as an inductor current detecting part, the value of the electric current passing through the capacitor 19.

Figure 4:
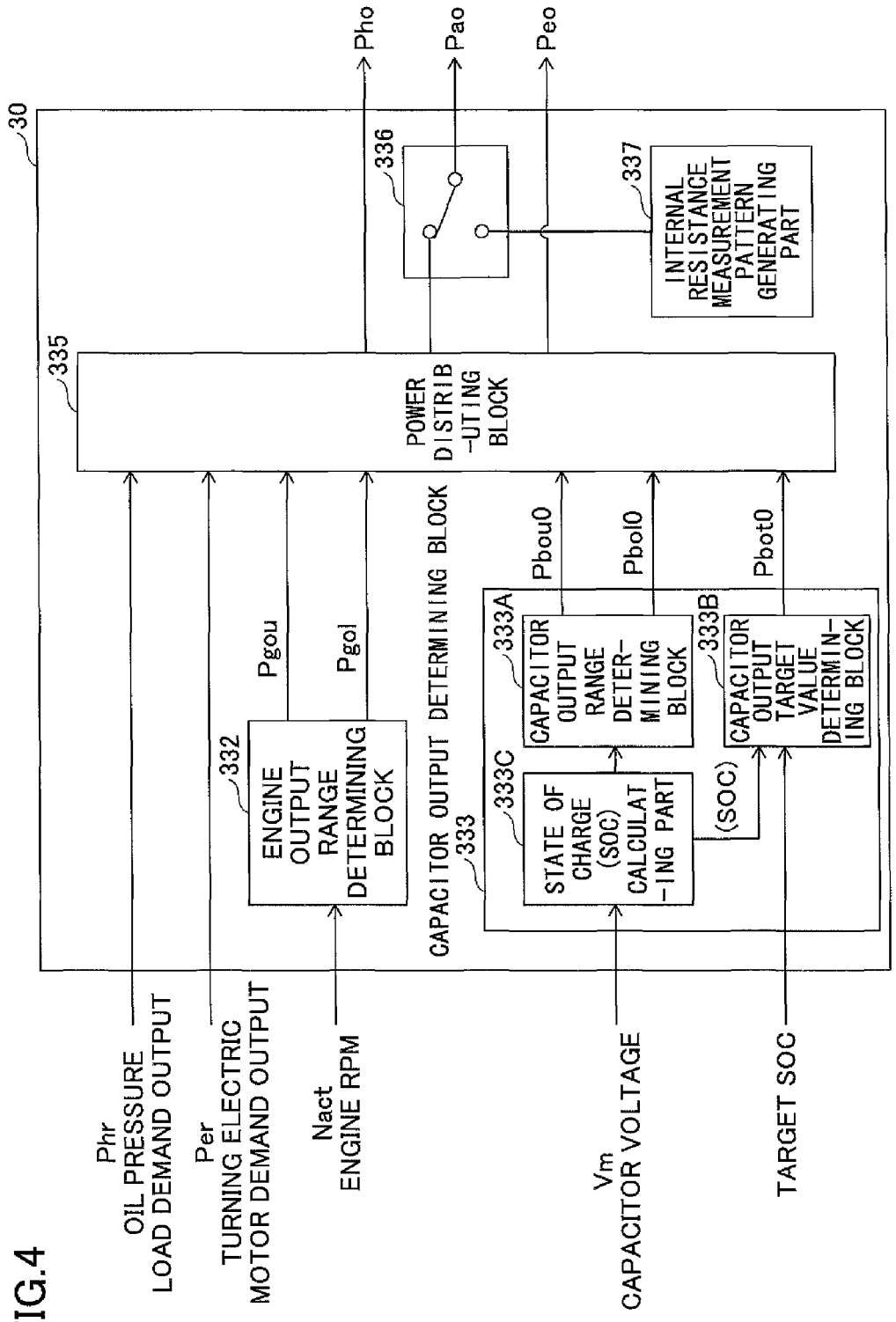
FIG. 4 is a control diagram for illustrating an example of a main control of a controller 30.

FIG. 4 is a control diagram for illustrating an example of a main control of a controller 30. To the controller 30 are input an oil pressure load demand output Phr, a turning electric motor demand output Per, an engine rpm Nact and a capacitor voltage Vm.

The oil pressure load demand output Phr is total mechanical power required for the hydraulic motors 1A (for right side), 1B (for left side) for the lower-part traveling body 1, the boom cylinder 7, the arm cylinder 8 and the bucket cylinder 9. For example, the oil pressure load demand output Phr is calculated based on the operation amounts of the lever 26B, the pedal 26C, etc., of the operation device 26.

The turning electric motor demand output Per corresponds to electric power required by the turning electric motor 21. For example, the turning electric motor demand output Per is calculated based on the operation amount of the lever 26A of the operation device 26.

The engine rpm Nact corresponds to an actual rpm of the engine 11. The engine 11 is constantly operated during the operation of the hybrid-type construction machine 100, and the engine rpm Nact is detected.

The capacitor voltage Vm corresponds to a voltage across the capacitor 19, and is detected by the voltage meter 74.

In an engine output range determining block 332, a map or a conversion table for determining an engine output upper limit value and an engine output lower limit value based on the engine rpm Nact is stored. The engine output range determining block 332 calculates the engine output upper limit value Pgou and the engine output lower limit value Pgol based on the input engine rpm Nact and supplies it to a power distributing block 335.

To a capacitor output determining block 333 are input the capacitor voltage Vm and a target SOC. The capacitor output determining block 333 includes a capacitor output range determining block 333A, a capacitor output target value determining block 333B and a state of charge (SOC) calculating part 333C. The SOC calculating part 333C calculates the state of charge (SOC) based on the input capacitor voltage Vm. The calculated SOC is supplied to the capacitor output range determining block 333A and the capacitor output target value determining block 333B.

In the capacitor output range determining block 333A, a map or a conversion table for determining a capacitor output upper limit value and a capacitor output lower limit value based on the SOC is stored. In the capacitor output target value determining block 333B, a map or a conversion table for determining a capacitor output target value based on the SOC and the target SOC is stored. For example, the map or the conversion table may define a relationship between a difference between the input SOC and the target SOC and the capacitor output target value. It is noted that the target SOC may be determined by any method, and the target SOC may be a fixed value or a variable value in a normal state (i.e., during the normal state except for a case where a pattern of the target SOC is generated as an internal resistance measurement pattern as described later). The capacitor output range determining block 333A determines first capacitor output upper and lower limit values Pbou0, Pbol0 based on the SOC, and supplies the determined values to the power distributing block 335. The capacitor output target value determining block 333B determines a first capacitor output target value Pbot0 based on the input SOC and the target SOC and supplies the determined value to the power distributing block 335.

The first capacitor output target value Pbot0 corresponds to an upper limit value of discharging electric power. The first capacitor output lower limit value Pbou0 is negative and its absolute value corresponds to an upper limit value of charging electric power. A proper range of the input/output voltage of the capacitor 19 is defined by second capacitor output upper and lower limit values Pbou1, Pbol1. For example, if degradation of the capacitor 19 is not detected based on an internal resistance measurement result described later, the following relationship is set; Pbou1=Pbou0, Pbol1=Pbol0. On the other hand, if the degradation of the capacitor 19 is detected, the following relationship is set; Pbou1<Pbou0, Pbol1>Pbol0.

The power distributing block 335 determines a final oil pressure load output Pho, a motor generator output Pao for the motor generator 12 and a turning electric motor output Peo based on the oil pressure load demand output Phr, the turning electric motor demand output Per, the engine output upper limit value Pgou, the engine output lower limit value Pgol, the first capacitor output upper and lower limit values Pbou0, Pbol0 and the first capacitor output target value Pbot0. Then, the power distributing block 335 determines the final oil pressure load output Pho, the motor generator output Pao for the motor generator 12 and the turning electric motor output Peo such that the engine output falls within a range defined by the engine output upper limit value Pgou and the engine output lower limit value Pgol, and the capacitor output falls within a range defined by the first capacitor output upper and lower limit values Pbou0, Pbol0.

The motor generator output Pao for the motor generator 12 output from the power distributing block 335 is output from the controller 30 directly via a switching part 336 in a normal state (i.e., during the normal state except for a case where a pattern of the motor generator output Pao for the motor generator 12 is generated as an internal resistance measurement pattern as described later). On the other hand, if the pattern of the motor generator output Pao for the motor generator 12 is generated as an internal resistance measurement pattern as described later, the switching part 336 works such that the pattern of the motor generator output Pao (i.e., the internal resistance measurement pattern as described later) generated in an internal resistance measurement pattern generating part 337 is output from the controller 30 instead of the pattern of the motor generator output Pao for the motor generator 12 output from the power distributing block 335.

The controller 30 controls the engine 11, the inverters 18 and 20, and the converter 1000 based on the determined outputs.

Figure 5:
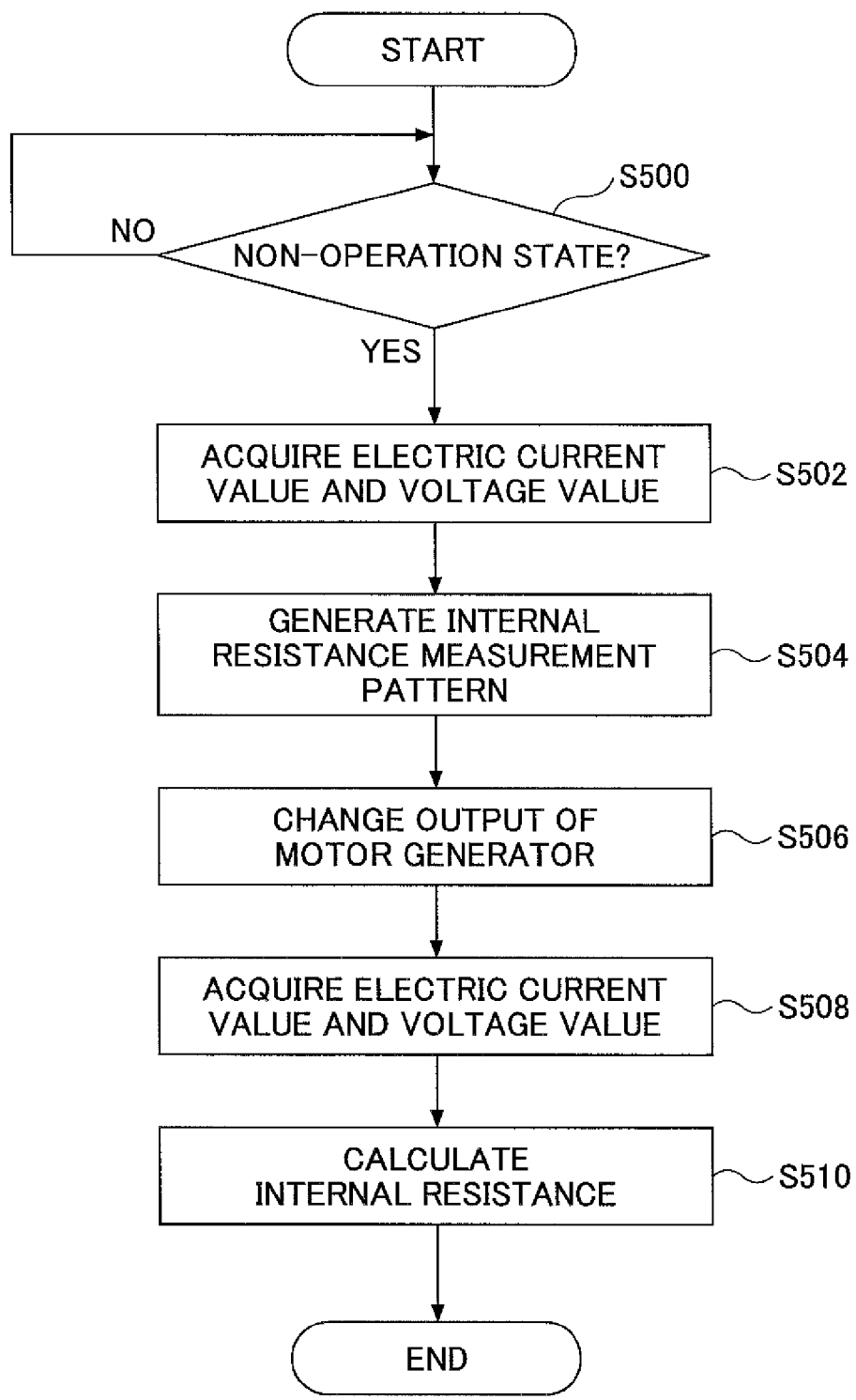
FIG. 5 is a flowchart for showing a main part of a process for measuring an internal resistance of the capacitor 19, which is executed by a controller 30.

FIG. 5 is a flowchart for showing a main part of a process for measuring an internal resistance of the capacitor 19, which is executed by the controller 30. The process routine illustrated in FIG. 5 is executed under a situation where the engine 11 is operated.

In step 500, it is determined whether a non-operation status is formed in which there is no operation from an operator based on the operation status of the operation device 26 (the levers 26A and 26B, and the pedal 26C). In other words, it is determined whether a non-operation status is formed in which there is no operation of the levers 26A and 26B, and the pedal 26C. If it is determined that the current status is the non-operation status, the process routine goes to step 502. Otherwise the process routine returns to step 500.

In step 502, the electric current value and the voltage value at the present moment is acquired from the electric current sensor 72 and the voltage meter 74. It is noted that in step 502 the electric current values and the voltage values at plural time points over a predetermined time may be acquired. The electric current value and the voltage value acquired in step 502 correspond to the electric current value and the voltage value acquired before an output change described later (i.e., the electric current value and the voltage value before the output change).

In step 504, a predetermined internal resistance measurement pattern is generated as a control instruction. The internal resistance measurement pattern may be any pattern which can induce change from a state in which there is substantially no charging or discharging in the capacitor 19 to a state in which the charging or the discharging is performed. For example, the internal resistance measurement pattern may be a pattern of the motor generator output Pao for the motor generator 12 (i.e., an assist instruction pattern). In this case, the pattern of the motor generator output Pao with which the charging or the discharging is performed in the capacitor 19 is generated as an internal resistance measurement pattern. For example, in the example illustrated in FIG. 4, the switching part 336 works such that the pattern of the motor generator output Pao (i.e., the internal resistance measurement pattern) generated in an internal resistance measurement pattern generating part 337 is output instead of the pattern of the motor generator output Pao for the motor generator 12 output from the power distributing block 335.

In step 506, the output of the motor generator 12 is changed as a result of the internal resistance measurement pattern generated in step 504. For example, the output (operation status) of the motor generator 12 is changed from a non-operation status to a power running status or a charging operation status.

It is noted that if there is an operation from the operator during the processes of step 504 and 506, the processes of step 504 and 506 may discontinue to return to step 500 (i.e., a higher priority is put on the operation from the operator).

In step 508, the electric current value and the voltage value after the change of the output of the motor generator 12 are acquired. The electric current value and the voltage value after the change of the output of the motor generator 12 may include the electric current value and the voltage value during a course of the change. It is noted that in step 508 the electric current values and the voltage values at plural time points over a predetermined time may be acquired. The electric current value and the voltage value acquired in step 508 correspond to the electric current value and the voltage value acquired after an output change (i.e., the electric current value and the voltage value after the output change).

In step 510, the internal resistance of the capacitor 19 is measured (calculated) based on the electric current values and the voltage values before and after the output change of the motor generator 12 acquired in steps 502 and 508. A method of calculating the internal resistance may be any method, as long as the internal resistance is calculated based on the electric current values and the voltage values before and after the output change of the motor generator 12 acquired in steps 502 and 508.

Figure 6:
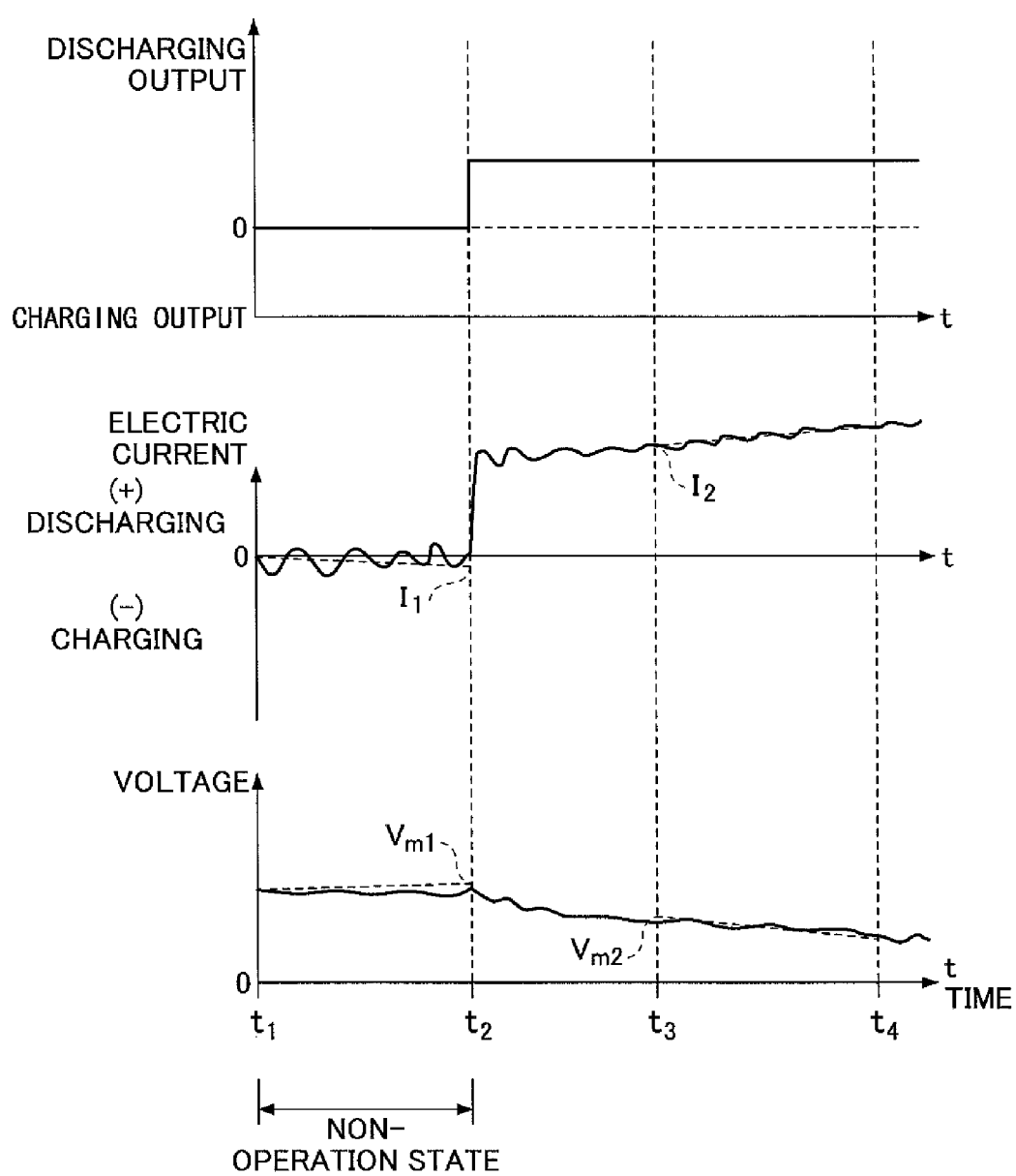
FIG. 6 is a control diagram for explaining an internal resistance calculating method illustrated in FIG. 5 in a time series.

FIG. 6 is a control diagram for illustrating an internal resistance calculating method illustrated in FIG. 5 in a time series. In FIG. 6, from an upper side, a output wave shape of the motor generator 12 (a wave shape of the assist instruction), a wave shape of the electric current values of the capacitor 19 and a wave shape of the voltage values of the capacitor 19 are illustrated, respectively.

In the example, the charging of the capacitor 19 is performed in a time period from time point 0 to time point t1. The non-operation status is formed during a time period from time point t1 to time point t2. Thus, a state in which there is substantially no charging or discharging in the capacitor 19 is formed during the time period from time point t1 to time point t2. At the time point t2, the predetermined internal resistance measurement pattern for changing the output of the motor generator such that it induces the discharging of the capacitor 19 is generated, and the discharging of the capacitor 19 is performed until time point t4.

In the example illustrated in FIG. 6, the internal resistance of the capacitor 19 is calculated by the following formula.

$$R = -(Vm2 - Vm1)/(I2 - I1)$$

Here, Vm1 and I1 are the voltage value and the electric current value before the output change of the motor generator 12, respectively. In the example illustrated in FIG. 6, Vm1 and I1 are the voltage value and the electric current value detected during the time period from time point t1 to time point t2. It is noted that Vm1 and I1 may be the voltage value and the electric current value detected at the time point t2 or immediately after the time point t2, or may be average values of the voltage values and the electric current values detected at a plural time points during the time period from time point t1 to time point t2, respectively. On the other hand, Vm2 and I2 are the voltage value and the electric current value after the output change of the motor generator 12, respectively. In the example, Vm2 and I2 are the voltage value and the electric current value detected during the time period from time point t2 to time point t4, respectively. However, preferably, Vm2 and I2 are the voltage value and the electric current value, respectively, which are detected during the time period from time point t3 to time point t4 in which the electric current stabilizes. Similarly, if the voltage value and the electric current value are detected at plural time points after the output change of the motor generator 12, Vm2 and I2 may be respective average values. Further, measurement may be performed before or after a voltage drop which occurs immediately after the discharging. In this case, Vm1 corresponds to the voltage value detected at the non-operation state, and Vm2 corresponds to the voltage value detected immediately after the voltage drop. Further, I2 corresponds to the electric current value (0 A) detected at the non-operation state, and Vm2 corresponds to the electric current value detected immediately after the voltage drop.

According to the internal resistance calculating method illustrated in FIG. 5, since the electric current values and the voltage values are acquired before and after the change from the state in which there is substantially no charging or discharging in the capacitor 19 to the state in which the charging or the discharging is performed, it is possible to precisely measure the internal resistance of the capacitor 19. Further, since the internal resistance measurement pattern is generated in the non-operation state, the internal resistance can be measured precisely under stable conditions, and there is no such a problem that the operations or functions of the hybrid-type construction machine 100 change due to the output change of the motor generator 12.

Figure 7:
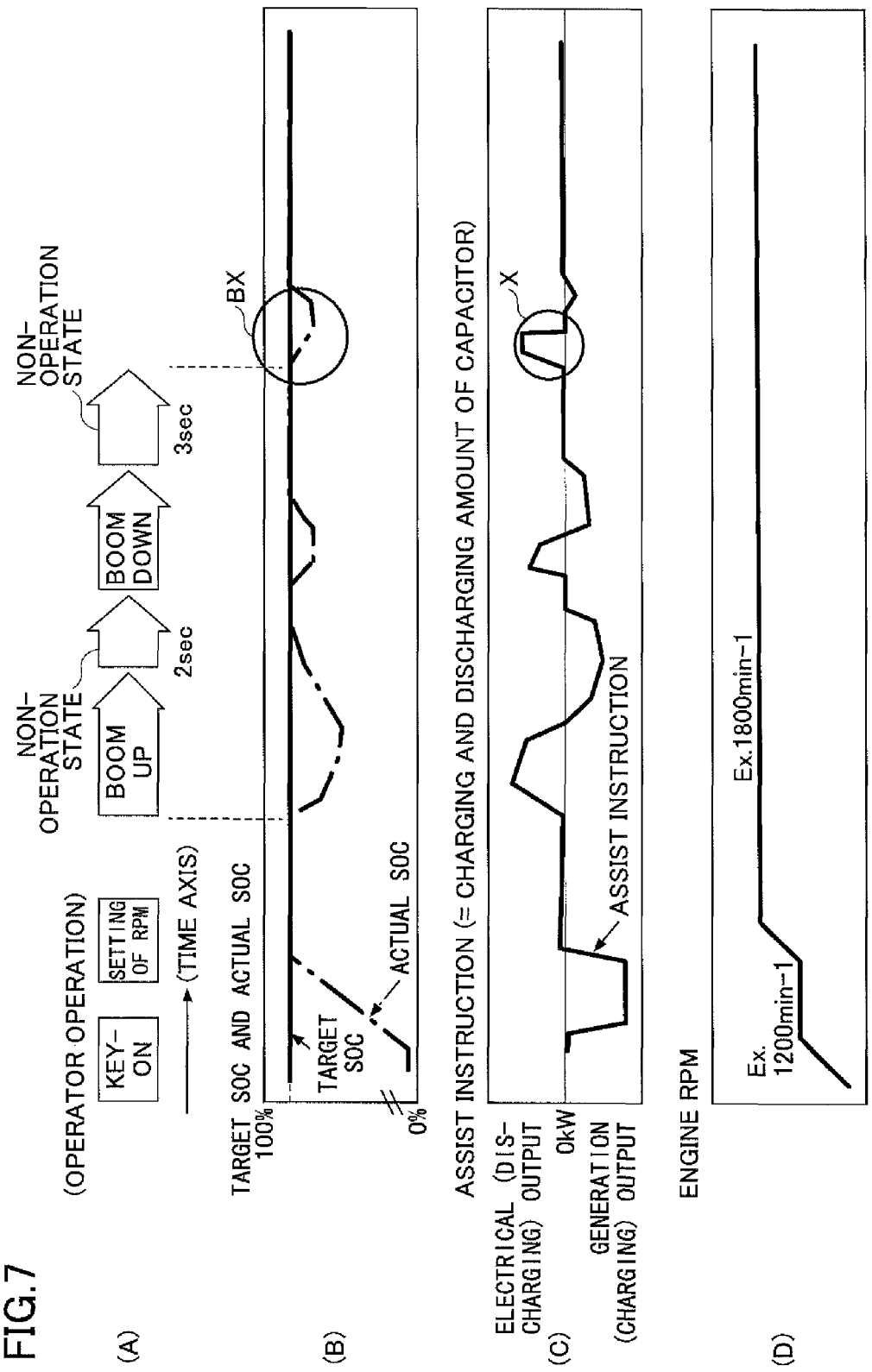
FIG. 7 is a diagram for illustrating a way of generating an internal resistance measurement pattern according to a first embodiment.

Next, with reference to drawings from FIG. 7, running states of the hybrid-type construction machine 100 based on a preferred internal resistance measurement pattern, which may be adopted in the internal resistance calculating method illustrated in FIG. 5, are described as some embodiments.

[First Embodiment]

FIG. 7 is a diagram for illustrating a running state of the hybrid-type construction machine 100 according to a first embodiment. In FIG. 7, from an upper side, (A) time series of the operation from the operator, (B) time-series wave shapes of the target SOC and the actual SOC, (C) time-series wave shape of the assist instruction (output of the motor generator 12), and (D) time-series wave shape of the engine rpm are illustrated at the same time axis.

In the illustrated example, the engine 11 of the hybrid-type construction machine 100 is started by a key-on operation by an operator, and the engine rpm is set. In the illustrated example, the engine rpm is increased from 1200 to 1800. Since the actual SOC is lower than the target SOC (fixed value in this example) immediately after the start of the engine 11, the assist instruction of the motor generator 12 is output and thus the actual SOC is increased toward the target SOC. After the engine rpm stabilizes at 1800, when the operator performs a boom up operation or a boom down operation, a boom up or a boom down is implemented correspondingly. The respective operations require electrical output of the motor generator 12 and thus the electric current is brought from the capacitor 19. Thus, the actual SOC decreases again with respect to the target SOC. But, after the respective operations, a generating instruction of the motor generator 12 is output according to the difference between the actual SOC and the target SOC, and thus the actual SOC increases to the target SOC. When the non-operation state is generated for 3 seconds after the boom down operation, the internal resistance measurement pattern is generated.

In the first embodiment, as described above, the internal resistance measurement pattern is generated as a pattern of the assist instruction of the motor generator 12, as illustrated by a portion indicated by X in FIG. 7 (C). Specifically, when the non-operation state is formed, such a pattern of the assist instruction that the output of the motor generator 12 induces the discharging of the capacitor 19 is generated as the internal resistance measurement pattern, as illustrated by a portion indicated by X in FIG. 7 (C). In this way, the process of step 504 in FIG. 5 may be executed. Then, the electric current value and the voltage value after the change of the output of the motor generator 12 (including the electric current value and the voltage value during a course of the change) are acquired, and the internal resistance of the capacitor 19 is calculated based on the acquired values (see steps 506 through 510 in FIG. 5). It is noted that the actual SOC changes in response to the change of the assist instruction as indicated by BX.

It is noted that in the illustrated example, with respect to the process of step 500 in FIG. 5, the non-operation state is detected if it continues for a predetermined time, specifically, 3 seconds. For example, as illustrated in FIG. 7 (A), the non-operation states are generated for 2 seconds during the boom up operation and the boom down operation, respectively; however, the internal resistance measurement pattern is not generated for these non-operation states. It is noted that a duration time of the non-operation state which causes the internal resistance measurement pattern to be generated is arbitrary. If it can be predicted (anticipated) that the non-operation state continues, the duration time may be very short (ultimately 0).

[Second Embodiment]

Figure 8:
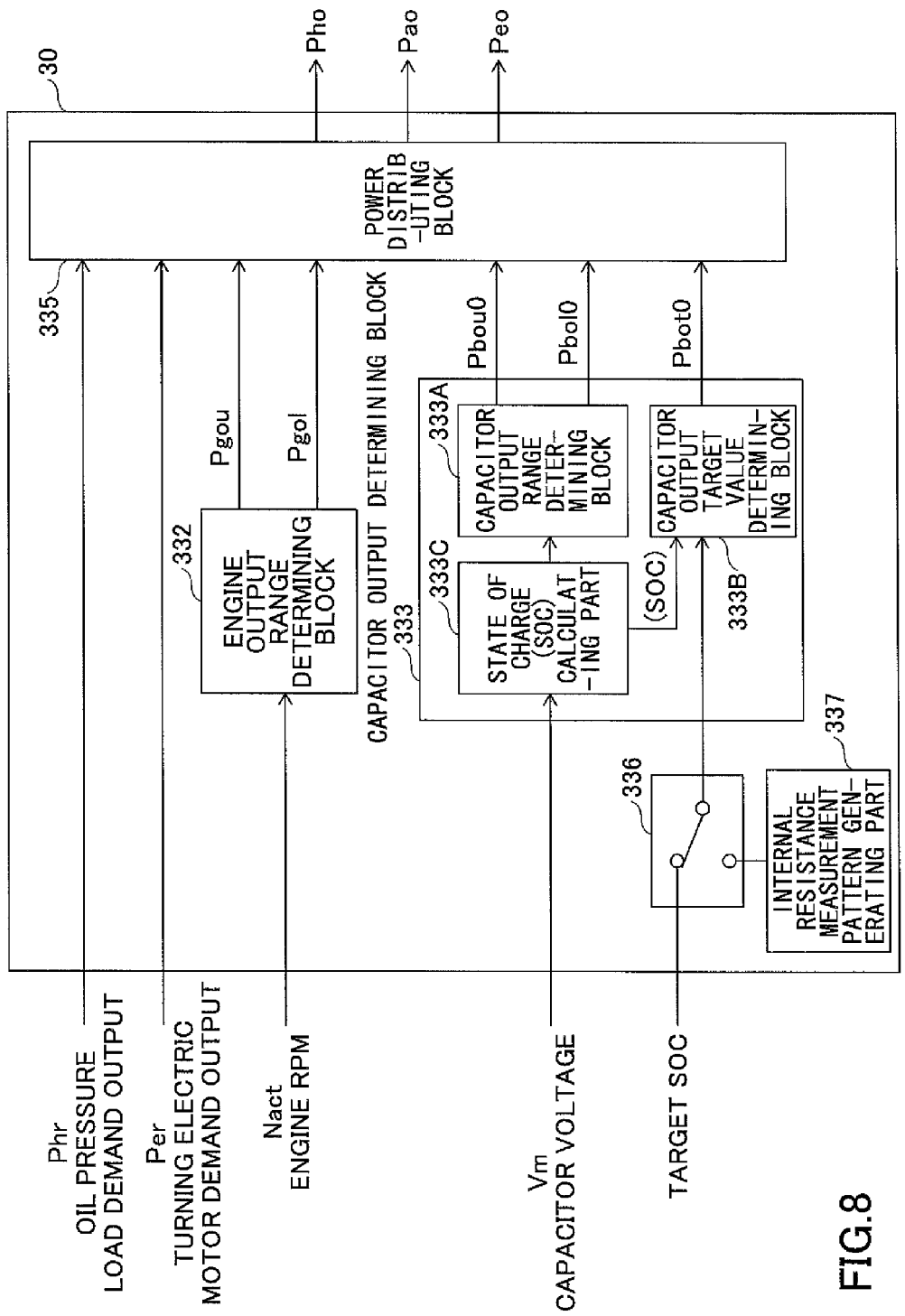
FIG. 8 is a control diagram for illustrating an example of a main control of a controller 30 according to a second embodiment.

FIG. 8 is a control diagram for illustrating an example of a main control of a controller 30 according to a second embodiment. To the controller 30 are input an oil pressure load demand output Phr, a turning electric motor demand output Per, an engine rpm Nact and a capacitor voltage Vm.

The oil pressure load demand output Phr is total mechanical power required for the hydraulic motors 1A (for right side), 1B (for left side) for the lower-part traveling body 1, the boom cylinder 7, the arm cylinder 8 and the bucket cylinder 9. For example, the oil pressure load demand output Phr is calculated based on the operation amounts of the lever 26B, the pedal 26C, etc., of the operation device 26.

The turning electric motor demand output Per corresponds to electric power required by the turning electric motor 21. For example, the turning electric motor demand output Per is calculated based on the operation amount of the lever 26A of the operation device 26.

The engine rpm Nact corresponds to an actual rpm of the engine 11. The engine 11 is constantly operated during the operation of the hybrid-type construction machine 100, and the engine rpm Nact is detected.

The capacitor voltage Vm corresponds to a voltage across the capacitor 19, and is detected by the voltage meter 74.

In an engine output range determining block 332, a map or a conversion table for determining an engine output upper limit value and an engine output lower limit value based on the engine rpm Nact is stored. The engine output range determining block 332 calculates the engine output upper limit value Pgou and the engine output lower limit value Pgol based on the input engine rpm Nact and supplies it to a power distributing block 335.

To a capacitor output determining block 333 are input the capacitor voltage Vm and a target SOC. The capacitor output determining block 333 includes a capacitor output range determining block 333A, a capacitor output target value determining block 333B and a state of charge (SOC) calculating part 333C. The SOC calculating part 333C calculates the state of charge (SOC) based on the input capacitor voltage Vm. The calculated SOC is supplied to the capacitor output range determining block 333A and the capacitor output target value determining block 333B.

In the capacitor output range determining block 333A, a map or a conversion table for determining a capacitor output upper limit value and a capacitor output lower limit value based on the SOC is stored. In the capacitor output target value determining block 333B, a map or a conversion table for determining a capacitor output target value based on the SOC and the target SOC is stored. For example, the map or the conversion table may define a relationship between a difference between the input SOC and the target SOC and the capacitor output target value.

It is noted that the target SOC may be determined in any methods, and the target SOC may be a fixed value or a variable value in a normal state (i.e., during the normal state except for a case where a pattern of the target SOC is generated as an internal resistance measurement pattern as described later). The target SOC is input to the capacitor output target value determining block 333B via the switching part 336 in the normal state. On the other hand, if a pattern of the target SOC is generated as an internal resistance measurement pattern as described later, the switching part 336 works such that the pattern of the target SOC (i.e., the internal resistance measurement pattern as described later) generated in an internal resistance measurement pattern generating part 337 is input to the capacitor output target value determining block 333B instead of the pattern of the target SOC at the time of the normal state.

The capacitor output range determining block 333A determines first capacitor output upper and lower limit values Pbou0, Pbol0 based on the SOC, and supplies the determined values to the power distributing block 335. The capacitor output target value determining block 333B determines a first capacitor output target value Pbot0 based on the input SOC and the target SOC and the supplies the determined value to the power distributing block 335.

The first capacitor output target value Pbot0 corresponds to an upper limit value of discharging electric power. The first capacitor output lower limit value Pbou0 is negative and its absolute value corresponds to an upper limit value of charging electric power. A proper range of the input/output voltage of the capacitor 19 is defined by second capacitor output upper and lower limit values Pbou1, Pbol1. For example, if degradation of the capacitor 19 is not detected based on an internal resistance measurement result described later, the following relationship is set; Pbou1=Pbou0, Pbol1 Pbol0. On the other hand, if the degradation of the capacitor 19 is detected, the following relationship is set; Pbou1<Pbou0, Pbol1>Pbol0.

The power distributing block 335 determines a final oil pressure load output Pho, a motor generator output Pao for the motor generator 12 and a turning electric motor output Peo based on the oil pressure load demand output Phr, the turning electric motor demand output Per, the engine output upper limit value Pgou, the engine output lower limit value Pgol, the first capacitor output upper and lower limit values Pbou0, Pbol0 and the first capacitor output target value Pbot0. Then, the power distributing block 335 determines the final oil pressure load output Pho, the motor generator output Pao for the motor generator 12 and the turning electric motor output Peo such that the engine output falls within a range defined by the engine output upper limit value Pgou and the engine output lower limit value Pgol, and the capacitor output falls within a range defined by the first capacitor output upper and lower limit values Pbou0, Pbol0.

The motor generator output Pao for the motor generator 12 output from the power distributing block 335 is output directly from the controller 30. The controller 30 controls the engine 1, the inverters 18 and 20, and the converter 1000 based on the determined outputs.

Figure 9:
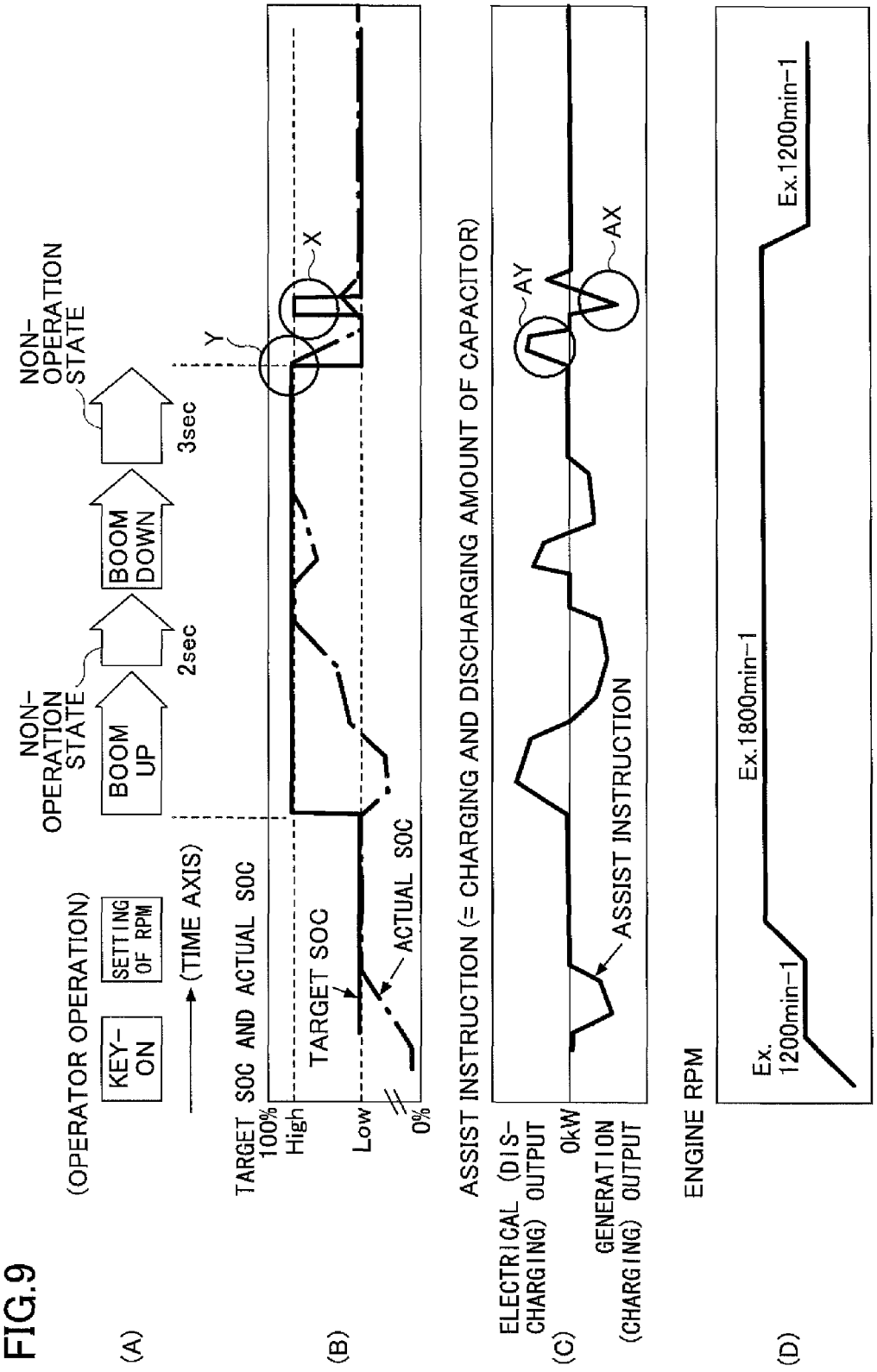
FIG. 9 is a diagram for illustrating a way of generating an internal resistance measurement pattern according to the second embodiment.

FIG. 9 is a diagram for illustrating a running state of the hybrid-type construction machine 100 according to a second embodiment. In FIG. 9, from an upper side, (A) time series of the operation from the operator, (B) time-series wave shapes of the target SOC and the actual SOC, (C) time-series wave shape of the assist instruction (output of the motor generator 12), and (D) time-series wave shape of the engine rpm are illustrated at the same time axis.

It is noted that a flow of the operation illustrated in FIG. 9 is substantially the same as that illustrated in FIG. 7 except for the generation of the internal resistance measurement pattern, and thus the explanation is omitted. In the second embodiment, the switching part 336 and the internal resistance measurement pattern generating part 337 are set in an input line to the capacitor output target value determining block 3333.

In the second embodiment, the internal resistance measurement pattern is generated as a target value pattern of the SOC of the capacitor 19, as illustrated by a portion indicated by X in FIG. 9 (B) Specifically, when the non-operation state is formed, such a target value pattern of the SOC that the output of the motor generator 12 induces the charging of the capacitor 19 is generated as the internal resistance measurement pattern, as illustrated by a portion indicated by X in FIG. 9 (B). In the illustrated example, the target value pattern of the SOC is switched from a lower target value (Low) to a higher target value (High). In this way, the process of step 504 in FIG. 5 may be executed. In this way, the assist instruction also changes in response to the change of the target SOC as indicated by a portion X (see a portion indicated by AX). Then, the electric current value and the voltage value after the change of the output of the motor generator 12 (including the electric current value and the voltage value during a course of the change) due to the change of the target value pattern of the SOC is acquired, and the internal resistance of the capacitor 19 is calculated based on the acquired values (see steps 506 through 510 in FIG. 5).

Alternatively, such a target value pattern of the SOC that the output of the motor generator 12 induces the discharging of the capacitor 19 is generated as the internal resistance measurement pattern, as illustrated by a portion indicated by Y in FIG. 9 (B). This target value pattern of the SOC may be related to a function of decreasing the SOC in order to extend the longevity of the capacitor 19 in the non-operation status. Specifically, in the illustrated example, the target value pattern of the SOC is switched from a higher target value (High) to a lower target value (Low). In this way, the process of step 504 in FIG. 5 may be executed. The assist instruction also changes in response to the change of the target SOC as indicated by a portion Y (see a portion indicated by AY). Then, the electric current value and the voltage value after the change of the output of the motor generator 12 (including the electric current value and the voltage value during a course of the change) due to the change of the target value pattern of the SOC is acquired, and the internal resistance is calculated based on the acquired values (see steps 506 through 510 in FIG. 5).

In a range of the portion Y, it is not guaranteed that the actual SOC at the time of the non-operation state certainly follows the higher target value (High), and thus the measurement accuracy of the electric current value I1 and the voltage value Vm1 of the capacitor 19 may decrease. For this reason, by generating the pattern (see X portion) in which the target value is switched from the lower target value (Low) to the higher target value (High) after the target value has been reduced to the lower target value (Low), it becomes possible to precisely measure the internal resistance of the capacitor 19.

The output of the motor generator 12 is determined based on the input of the target SOC, as described with reference to FIG. 4. In the non-operation state, the oil pressure load demand output Phr and the turning electric motor demand output Per among the inputs other than the target SOC are 0. On the other hand, an engine output value is constant because of no load. Thus, the assist output Pao can be changed and thus the charging current or the discharging current can be generated by changing the target SOC. It is noted that as a result of this the actual SOC also changes, as illustrated in FIG. 9 (B).

It is noted that in the illustrated example, with respect to the process of step 500 in FIG. 5, the non-operation state is detected if it continues for a predetermined time, specifically, 3 seconds. For example, as illustrated in FIG. 9 (A), the non-operation states are generated for 2 seconds during the boom up operation and the boom down operation, respectively; however, the internal resistance measurement pattern is not generated for these non-operation states. It is noted that a duration time of the non-operation state which causes the internal resistance measurement pattern to generate is arbitrary. If it can be predicted (anticipated) that the non-operation state continues, the duration time may be very short (ultimately 0).

[Third Embodiment]

Figure 10:
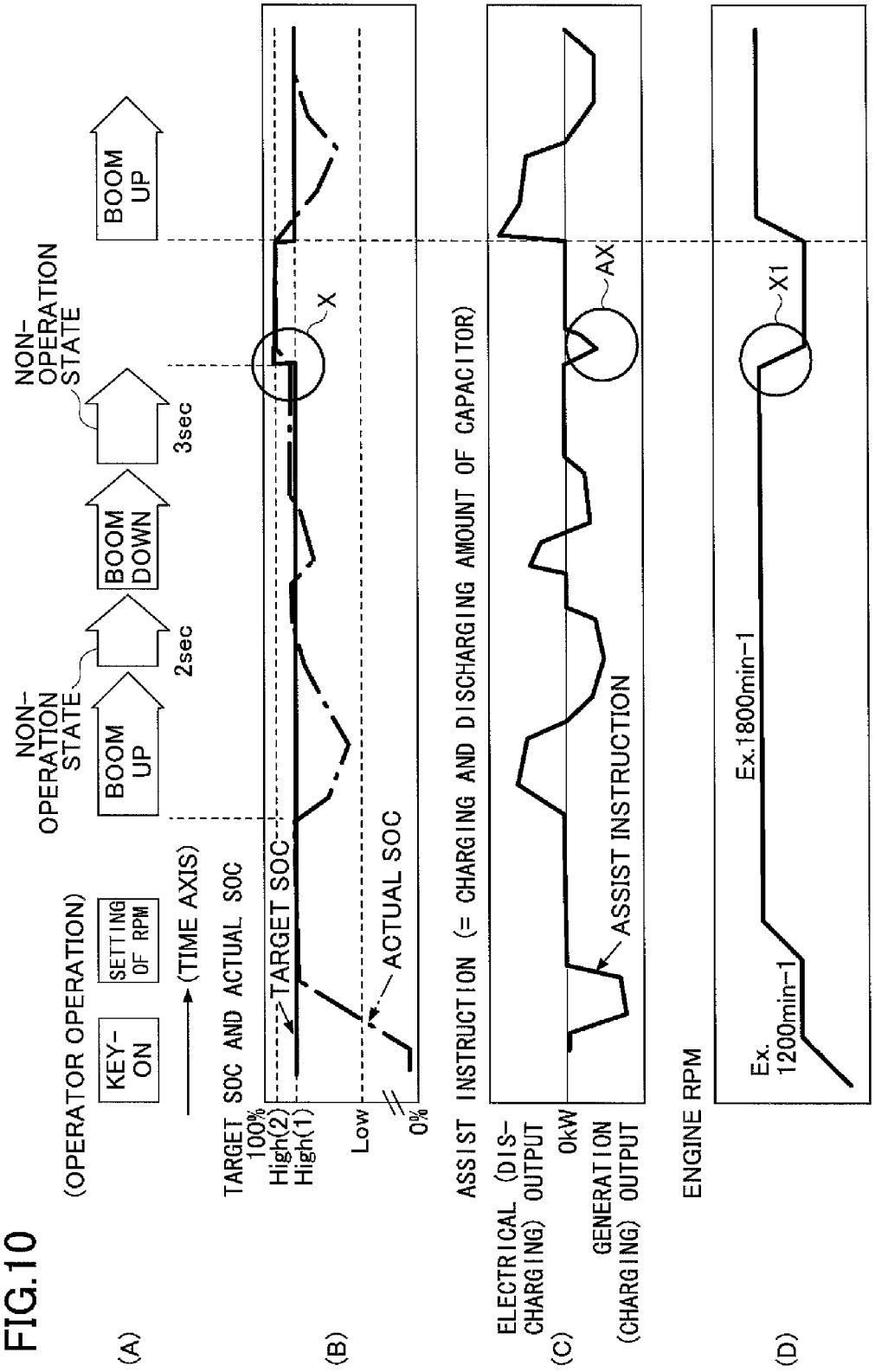
FIG. 10 is a diagram for illustrating a way of generating an internal resistance measurement pattern according to a third embodiment.

FIG. 10 is a diagram for illustrating a running state of the hybrid-type construction machine 100 according to a third embodiment. In FIG. 10, from an upper side, (A) time series of the operation from the operator, (B) time-series wave shapes of the target SOC and the actual SOC, (C) time-series wave shape of the assist instruction (output of the motor generator 12), and (D) time-series wave shape of the engine rpm are illustrated at the same time axis.

It is noted that a flow of the operation illustrated in FIG. 10 is substantially the same as that illustrated in FIG. 7 except for the generation of the internal resistance measurement pattern, and thus the explanation is omitted. In the third embodiment, the switching part 336 and the internal resistance measurement pattern generating part 337 are set in an input line to the capacitor output target value determining block 333B.

In the third embodiment, the internal resistance measurement pattern is generated as a target value pattern of the SOC and its generation is triggered by a change of a pattern of the engine rpm, as illustrated by a portion indicated by X in FIG. 10 (B) and a portion indicated by X1 in FIG. 10 (D). Specifically, when the non-operation state is formed or a predetermined time, the engine rpm decreases as illustrated by a portion indicated by X1 in FIG. 10 (D), and in synchronization with this, such a target value pattern of the SOC that the output of the motor generator 12 induces the charging of the capacitor 19 is generated as the internal resistance measurement pattern, as illustrated by a portion indicated by X in FIG. 10 (B). In other words, in the present embodiment, the change of the pattern of the engine rpm triggers generating the target value pattern of the SOC as the internal resistance measurement pattern such that the output of the motor generator 12 induces the charging of the capacitor 19. In the illustrated example, the target value pattern of the SOC is switched from a higher first target value (High (1)) to a further higher second target value (High (2)). In this way, the process of step 504 in FIG. 5 may be executed. In this way, the assist instruction changes in response to the change of the target SOC as indicated by a portion X (see a portion indicated by AX). Then, the electric current value and the voltage value after the change of the output of the motor generator 12 (including the electric current value and the voltage value during a course of the change) due to the change of the target value pattern of the SOC are acquired, and the internal resistance of the capacitor 19 is calculated based on the acquired values (see steps 506 through 510 in FIG. 5).

The change of the engine rpm is related to an automatic idling function or a one-touch idling function which decreases the engine rpm to an idling rpm automatically or manually in the non-operation state. In other words, the change of the engine rpm (i.e., reduction of the engine rpm to the idling rpm) which occurs when the automatic idling function or the one-touch idling function is implemented may be used as a trigger for the generation of the internal resistance measurement pattern.

It is noted that also in the third embodiment, as is the case with the second embodiment illustrated in FIG. 9, the target SOC is changed and the assist output Pao is changed correspondingly, thereby obtaining desired electric current and voltage wave shapes. Further, the third embodiment is characterized in that the motor generator 12 generates electricity not wasting energy at the time of changing (reducing) the engine rpm.

It is noted that in the illustrated example, with respect to the process of step 500 in FIG. 5, the non-operation state is detected if it continues for a predetermined time, specifically, 3 seconds. For example, as illustrated in FIG. 10 (A), the non-operation states are generated for 2 seconds during the boom up operation and the boom down operation, respectively; however, the internal resistance measurement pattern is not generated for these non-operation states. It is noted that a duration time of the non-operation state which causes the internal resistance measurement pattern to generate is arbitrary. If it can be predicted (anticipated) that the non-operation state continues, the duration time may be very short (ultimately 0).

Further, in the foregoing, the change of the pattern of the engine rpm triggers generating the target value pattern of the SOC as the internal resistance measurement pattern; however, the change of the pattern of the engine rpm may trigger generating the pattern of the assist instruction of the motor generator 12 as the internal resistance measurement pattern.

[Fourth Embodiment]

Figure 11:
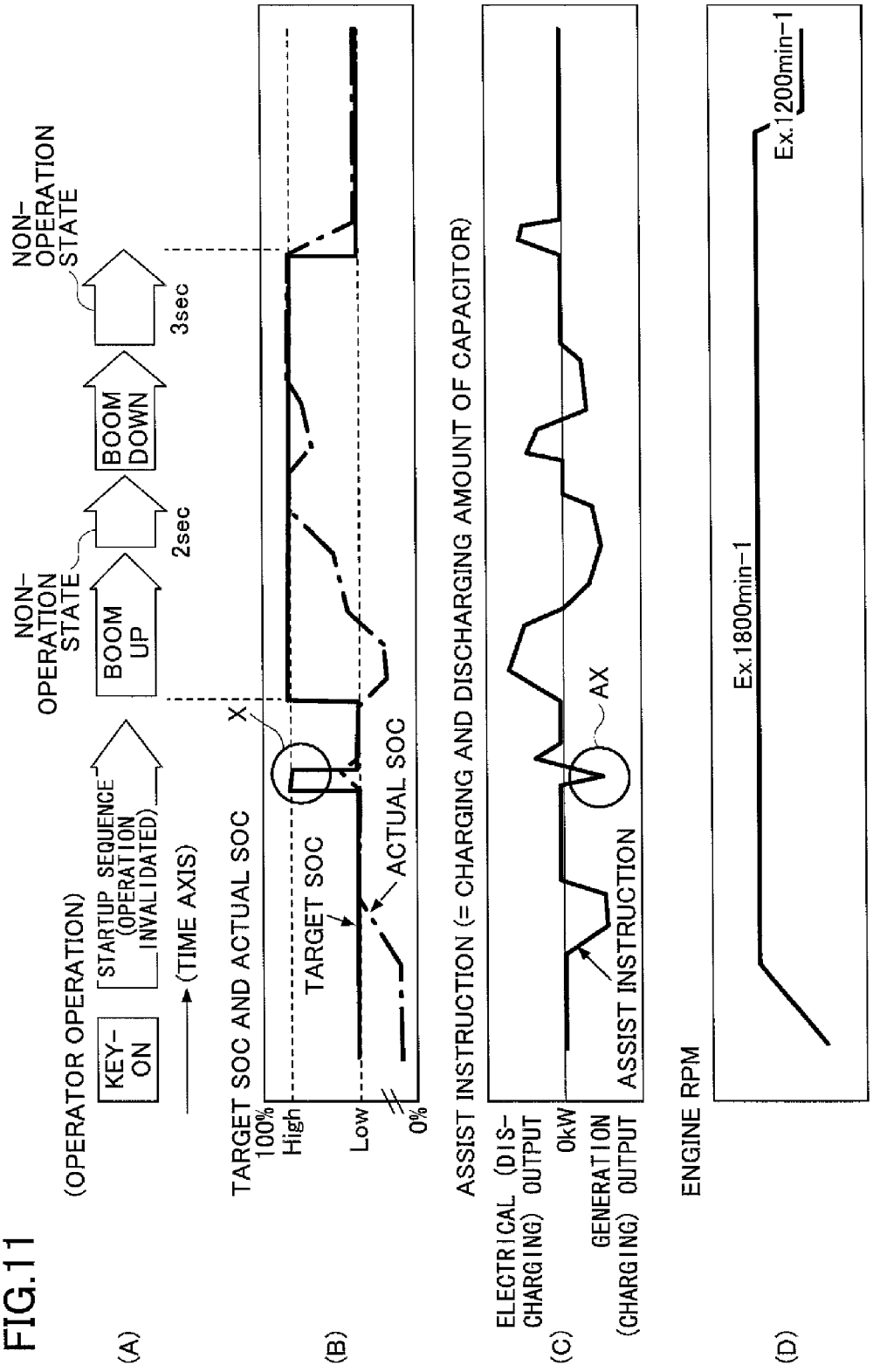
FIG. 11 is a diagram for illustrating a way of generating an internal resistance measurement pattern according to a fourth embodiment.

FIG. 11 is a diagram for illustrating a running state of the hybrid-type construction machine 100 according to a fourth embodiment. In FIG. 11, from an upper side, (A) time series of the operation from the operator, (B) time-series wave shapes of the target SOC and the actual SOC, (C) time-series wave shape of the assist instruction (output of the motor generator 12), and (D) time-series wave shape of the engine rpm are illustrated at the same time axis.

It is noted that a flow of the operation illustrated in FIG. 11 is substantially the same as that illustrated in FIG. 7 except for the generation of the internal resistance measurement pattern, and thus the explanation is omitted. In the fourth embodiment, the switching part 336 and the internal resistance measurement pattern generating part 337 are set in an input line to the capacitor output target value determining block 333B.

In the fourth embodiment, the internal resistance measurement pattern is generated before the operation from the operator is permitted after the key-on event, as illustrated in FIG. 11 (A) and a portion indicated by X in FIG. 11 (B). Specifically, if the operator performs the key-on operation in order to start the engine 11, etc., a startup sequence is initiated, and during this period the operation from the operator is invalidated. The internal resistance measurement pattern is generated utilizing this period. During the startup sequence, since the actual SOC is lower than the target SOC immediately after the start of the engine 11, the assist instruction of the motor generator 12 is output and thus the actual SOC is increased toward the target SOC. During the startup sequence, in order to enable the generation of the internal resistance measurement pattern described later, the lower target value (Low) is set instead of the higher target value (High).

Further, in the fourth embodiment, when the non-operation state is formed or a predetermined time, the internal resistance measurement pattern is generated as a target value pattern of the SOC of the capacitor 19, as illustrated by a portion indicated by X in FIG. 11 (B). Specifically, after a lapse of an operation time of the startup sequence in which the non-operation state is formed, such a target value pattern of the SOC that the output of the motor generator 12 induces the charging of the capacitor 19 is generated as the internal resistance measurement pattern, as illustrated by a portion indicated by X in FIG. 11 (B). Specifically, in the illustrated example, the target value pattern of the SOC is switched from a lower target value (Low) during the startup sequence to a higher target value (High). In this way, the process of step 504 in FIG. 5 may be executed. In this way, the assist instruction changes in response to the change of the target SOC as indicated by a portion X (see a portion indicated by AX). Then, the electric current value and the voltage value after the change of the output of the motor generator 12 (including the electric current value and the voltage value during a course of the change) due to the change of the target value pattern of the SOC is acquired, and the internal resistance is calculated based on the acquired values (see steps 506 through 510 in FIG. 5). With this arrangement, it is possible to precisely measure the internal resistance under a condition where a temperature, etc., are stable immediately after the start of the engine.

In the fourth embodiment, preferably, the internal resistance measurement pattern, that is to say, the target value pattern of the SOC in which the target SOC is switched from a lower target value (Low) to a higher target value (High) is generated in a state where the actual SOC has reached the target SOC, that is to say, the lower target value (Low). For this reason, the lower target value (Low) is set to a level which is reachable at some midpoint during the startup sequence. Typically, the lower target value (Low) is set to a value which is substantially lower than the target value at the time of the normal state (High, for example).

It is noted that in the fourth embodiment, the internal resistance measurement pattern may be generated as the instruction pattern of the motor generator 12 instead of the target value pattern of the SOC, as is the case with the first embodiment.

As a variant of the fourth embodiment, a key-off input may trigger generating the internal resistance measurement pattern. If the operator performs the key-off operation in order to stop the engine 11, etc., the internal resistance measurement pattern may be generated. Also in this case, the internal resistance measurement pattern may be generated as the target value pattern of the SOC, or generated as the instruction pattern of the motor generator 12, as is the case with the first embodiment. Further, in this case, after the key-off operation, a the time of completing the generation of the internal resistance measurement pattern and the reading of the voltage values, etc., the engine 11 may be turned off.

The first through fourth embodiments may be combined in any manner. Further, other requirement for the generation of the internal resistance measurement pattern may be added. For example, the internal resistance measurement pattern may be generated to measure the internal resistance, only if the engine rpm is greater than or equal to a predetermined value (for example, an ordinary rpm, 1800, in the illustrated example). This is because an engine sound does not change greatly due to the generation of the internal resistance measurement pattern if the engine rpm is high.

The present invention is disclosed with reference to the preferred embodiments. However, it should be understood that the present invention is not limited to the above-described embodiments, and variations and modifications may be made without departing from the scope of the present invention.

Figure 12:
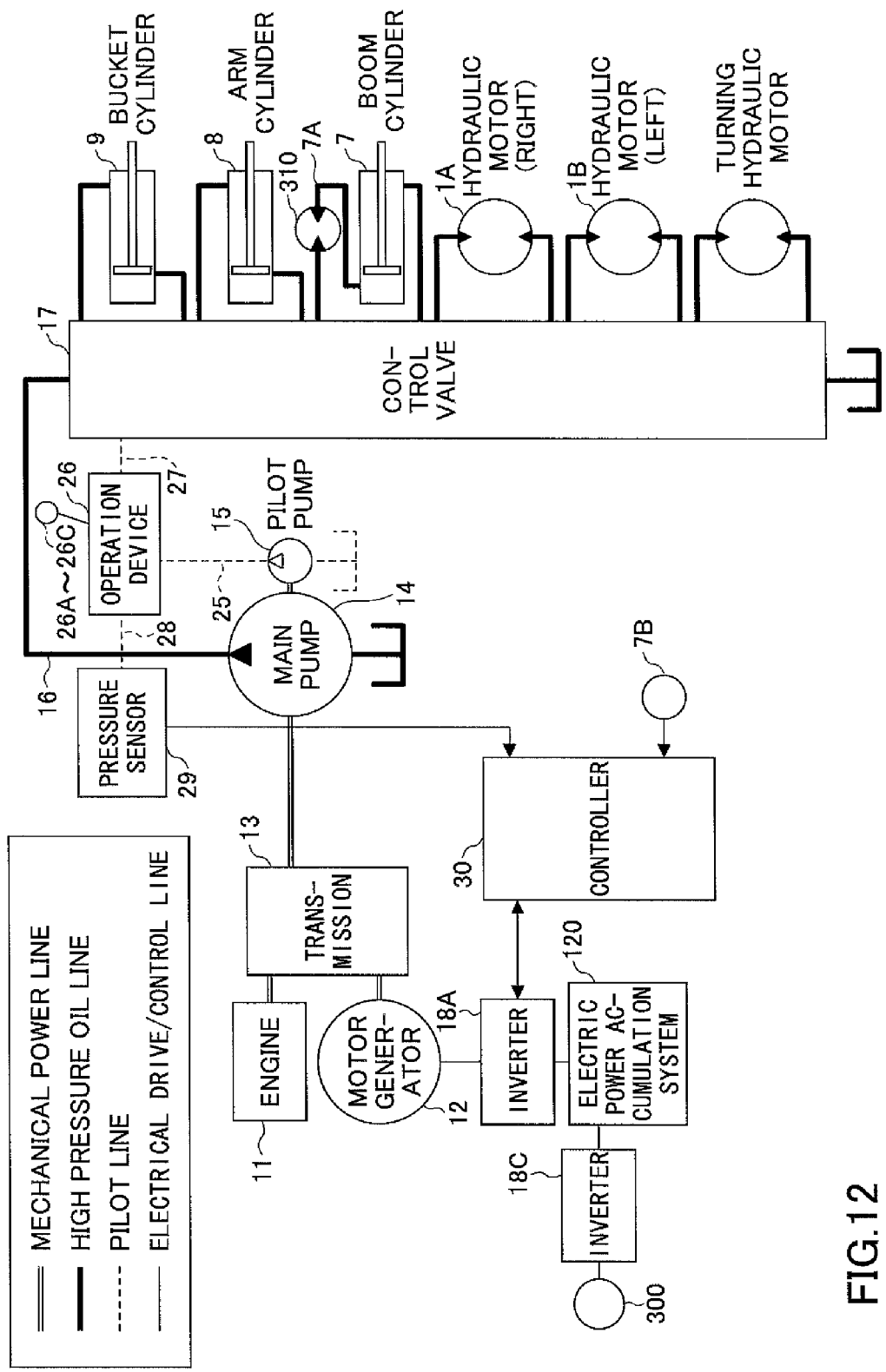
FIG. 12 is a diagram for illustrating an example of the hybrid-type construction machine in which all the driven parts are hydraulically operated.

For example, the present invention can be applied to such a configuration of the hybrid-type construction machine in which all the driven parts are hydraulically operated, as illustrated in FIG. 12. In the configuration of the hybrid-type construction machine illustrated in FIG. 12, generated output of the motor generator 12 using extra output of the engine and generated output of a boom motor generator 300 are accumulated in the electric power accumulation system 120. The accumulated power in the electric power accumulation system 120 is used to assist the output of the engine 11.

Figure 13:
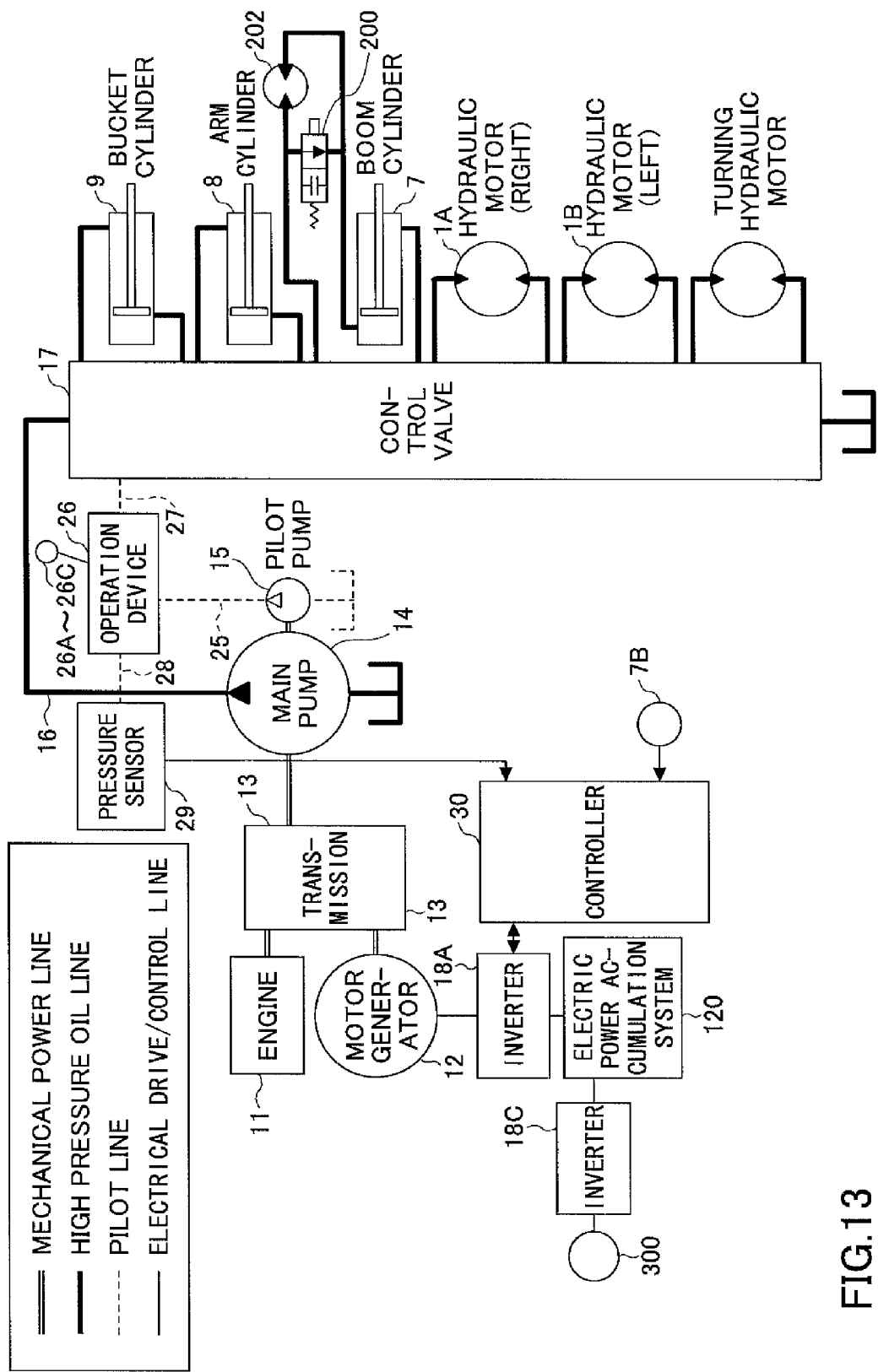
FIG. 13 is a diagram for illustrating a circuit related to a configuration in which the internal resistance is measured using a boom motor generator.
Figure 14:
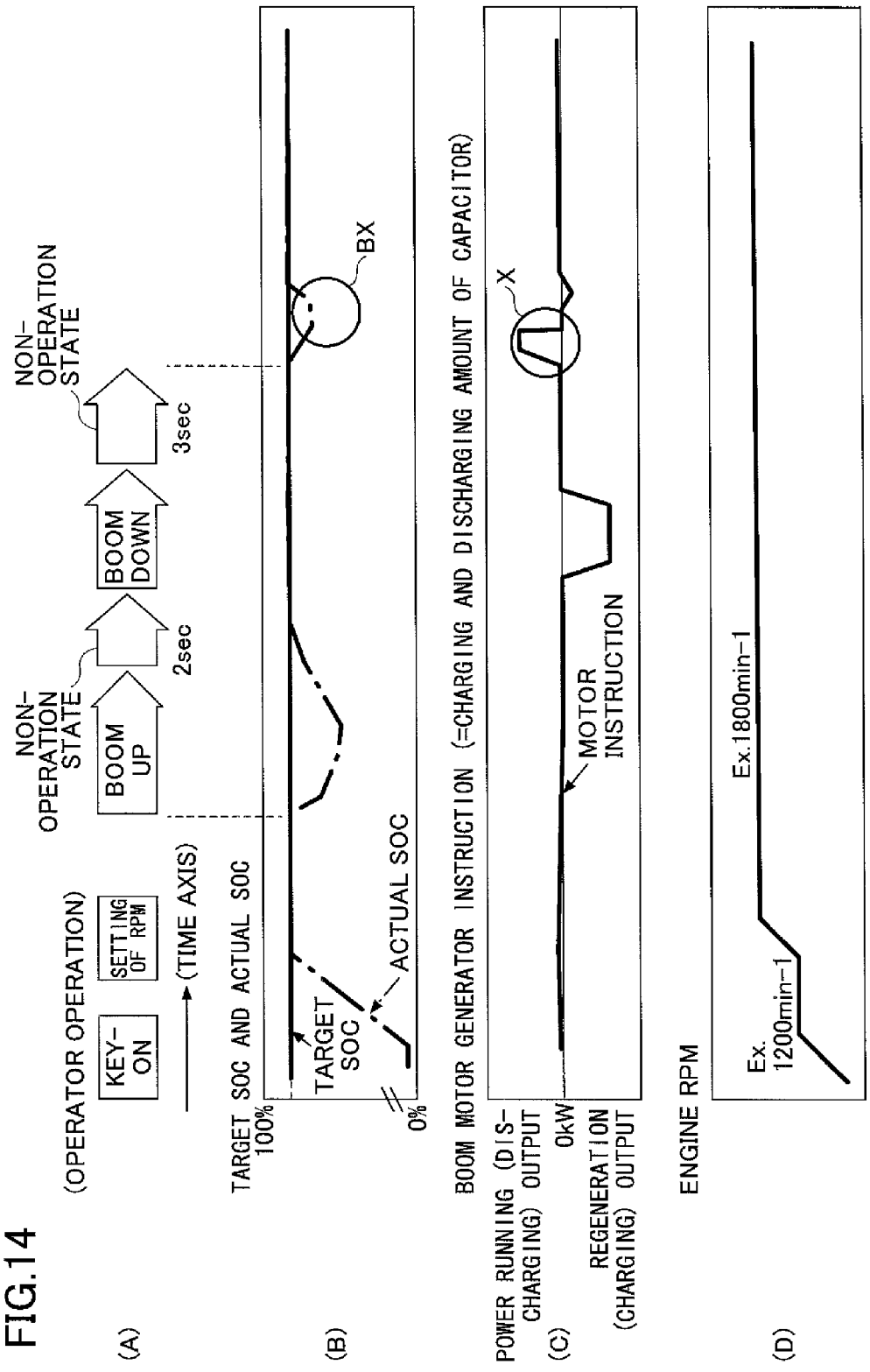
FIG. 14 is a diagram for illustrating wave shapes related to a configuration in which the internal resistance is measured using the boom motor generator.

FIG. 13 and FIG. 14 are diagrams for illustrating a circuit and wave shapes, respectively, related to a configuration in which the internal resistance is measured using a boom motor generator. In FIG. 14, from an upper side, (A) time series of the operation from the operator, (B) time-series wave shapes of the target SOC and the actual SOC, (C) time-series wave shape of a boom motor generator instruction, and (D) time-series wave shape of the engine rpm are illustrated at the same time axis. The boom motor generator 300 is connected to the electric power accumulation system 120 via an inverter 18C. The boom motor generator 300 drives a boom regenerative pump 202 with the power from the electric power accumulation system 120. When the non-operation state continues for more than or equal to 3 seconds, an electromagnetic switching valve 200 is switched to a connecting position. In this way, the boom regenerative pump 202 forms a circulation circuit. When instruction values according to the internal resistance measurement pattern are input to the boom motor generator 300 (see a portion X in FIG. 14 (C)), the power running is started based on the pattern instruction. Accordingly, the discharging of the capacitor 19 is started (see FIG. 14 (A)), and the measurement of the internal resistance is performed. It is noted that the actual SOC changes in response to the change of the assist instruction as indicated in a portion X, as indicated by BX in FIG. 14.

Figure 15:
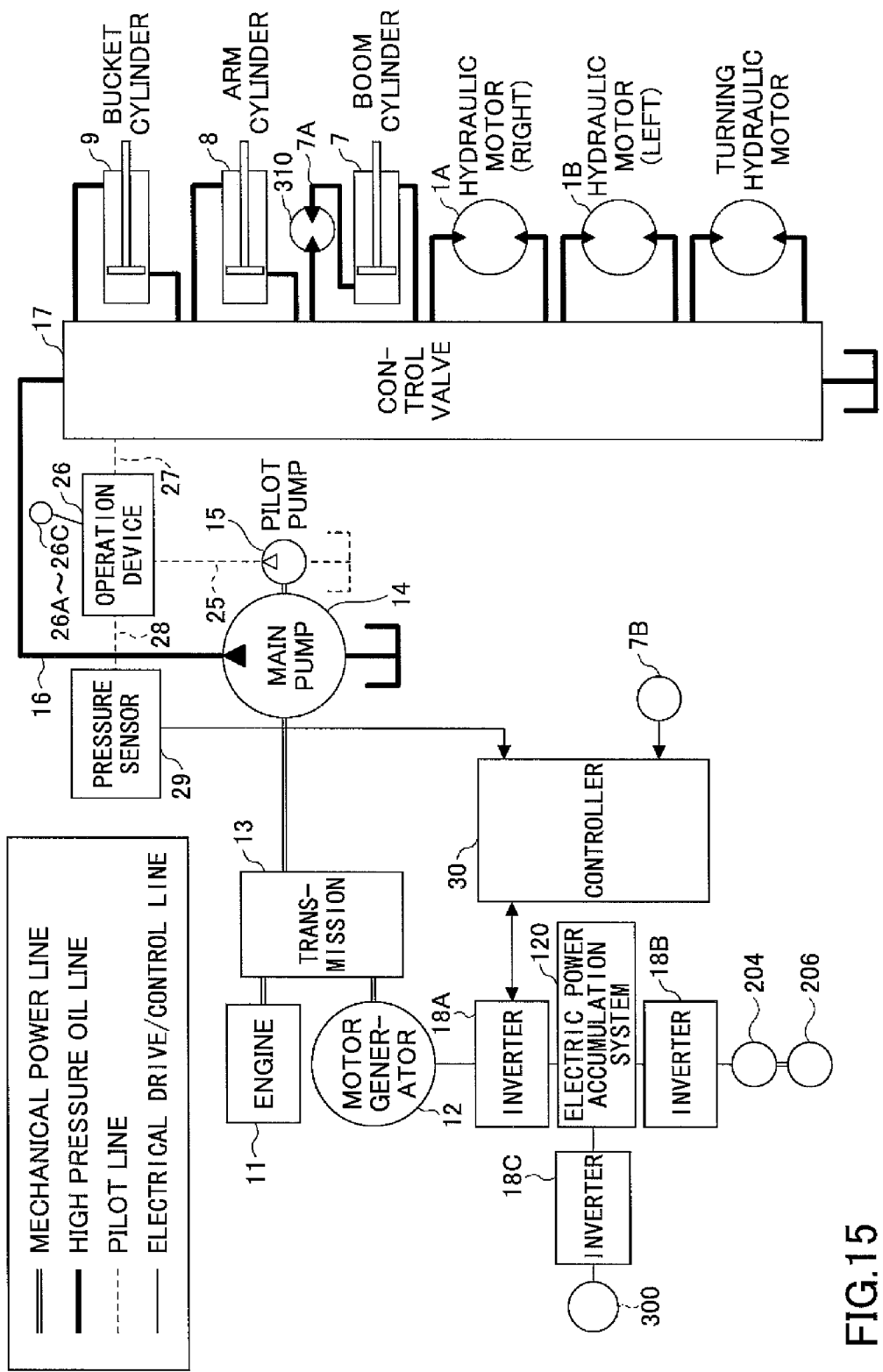
FIG. 15 is a diagram for illustrating a circuit related to a configuration in which the internal resistance is measured using a cooling pump motor.

FIG. 15 and FIG. 16 are diagrams for illustrating a circuit and wave shapes, respectively, related to a configuration in which the internal resistance is measured using a cooling pump motor. In FIG. 16, from an upper side, (A) time series of the operation from the operator, (B) time-series wave shapes of the target SOC and the actual SOC, (C) time-series wave shape of cooling pump motor instruction (output of the cooling pump motor), and (D) time-series wave shape of the engine rpm, and (F) time-series wave shape of the assist instruction (output of the motor generator 12) are illustrated at the same time axis. The cooling pump motor 204 is connected to the electric power accumulation system 120 via an inverter 18B. The cooling pump motor 204 drives a cooling pump 206 with the power from the electric power accumulation system 120. In the normal state, the cooling pump motor 204 is driven with the power of the motor generator 12. The cooling pump motor 204 keeps the normal output status even if the non-operation state continues for more than or equal to 3 seconds (see a portion X2 in FIG. 16 (C)). However, if the non-operation state continues for more than or equal to 3 seconds, the output of the motor generator 12 becomes 0 according to the instruction value of the internal resistance measurement pattern (see a portion X1 in FIG. 16 (E)). It is noted that the instruction value of the internal resistance measurement pattern in this example is 0. Thus, there is no power supply from the motor generator 12 to the cooling pump motor 204, and in order to compensate for this the discharging of the capacitor 19 is started (see FIG. 16 (A)). The measurement of the internal resistance is performed using the respective values detected at that time. It is noted that the actual SOC changes in response to the change of the assist instruction as indicated in a portion X, as indicated by BX in FIG. 16.

The present application is based on Japanese Priority Application No. 2009-213641, filed on Sep. 15, 2009, the entire contents of which are hereby incorporated by reference.

The invention claimed is:

1. A control method of a hybrid-type construction machine for measuring an internal resistance of an electric power accumulator of the hybrid-type construction machine including an engine, an electric generator that assists an output of the engine and generates electricity with the output of the engine, the electric power accumulator, a step-up and step-down transformer, a DC bus, and an inverter that is connected to the step-up and step-down transformer and the electric power accumulator via the DC bus for driving the generator using electric power from the electric power accumulator, the method comprising:
a pattern generating step of generating an internal resistance measurement pattern in a non-operation status in which there is no operation for the hybrid-type construction machine from an operator;
an output changing step of changing an output of the generator based on the pattern generated in the pattern generating step in the non-operation status such that a state of the electric power accumulator changes from a state where the electric power accumulator is not substantially charged or discharged to a state where the electric power accumulator is charged or discharged;
an electric current, etc., detecting step of detecting electric current values and voltage values in the electric power accumulator before and after the change of the output of the generator in the output changing step that causes the step-up and step-down transformer to change the state of the electric power accumulator; and
an internal resistance measuring step of measuring the internal resistance of the electric power accumulator based on the electric current values and the voltage values detected before and after the change of state of the electric power accumulator in the electric current, etc., detecting step.

2. The control method of claim 1, wherein the internal resistance measurement pattern generated in the pattern generating step is an instruction pattern for the generator, and
in the electric current, etc., detecting step, the electric current values and the voltage values are detected before and after a change in the instruction pattern.

3. The control method of claim 1, wherein the internal resistance measurement pattern generated in the pattern generating step is a target value pattern of SOC (State Of Charge) of the electric power accumulator, and
in the electric current, etc., detecting step, the electric current values and the voltage values are detected before and after a change in the target value pattern of SOC.

4. The control method of claim 1, wherein the pattern generating step generates the internal resistance measurement pattern before the operation from the operator is permitted after a key-on operation.

5. The control method of claim 1, wherein the pattern generating step generates the internal resistance measurement pattern using a key-off input as a trigger.

6. The control method of claim 2, wherein the generator is a regenerative generator.

7. The control method of claim 6, wherein an instruction pattern of the internal resistance is switched, and an electromagnetic switching valve is switched between a connecting position and a non-connecting position.

8. The control method of claim 7, wherein the electromagnetic switching valve is disposed outside of a control valve, and when the electromagnetic switching valve is switched to the connecting position, a circulation circuit of a regenerative pump is formed outside of the control valve.

9. The control method of claim 2, wherein the pattern generating step generates the internal resistance measurement pattern when an engine rpm is greater than a predetermined value in the non-operation status.

10. The control method of claim 3, wherein the pattern generating step generates the internal resistance measurement pattern when an engine rpm is greater than a predetermined value in the non-operation status.

11. A control method of measuring an internal resistance of an electric power accumulator of a hybrid-type construction machine including an engine, a generator, the electric power accumulator, and a driven part driven using electric power from the electric power accumulator, the method comprising:
a pattern generating step of generating an internal resistance measurement pattern in a non-operation status in which there is no operation for the hybrid-type construction machine from an operator;
an output changing step of changing an output of the generator based on the pattern generated in the pattern generating step in the non-operation status;
an electric current, etc., detecting step of detecting electric current values and voltage values in the electric power accumulator before and after the change of the output of the generator in the output changing step; and an internal resistance measuring step of measuring the internal resistance of the electric power accumulator based on the electric current values and the voltage values detected before and after the change of the output of the generator in the electric current, etc., detecting step, wherein generation of the internal resistance measurement pattern generated in the pattern generating step is triggered by a change in an engine rpm, and in the electric current, etc., detecting step, the electric current values and the voltage values are detected before and after a change in an engine rpm pattern.

12. A hybrid-type construction machine including an engine, an electric generator that assists an output of the engine and generates electricity with the output of the engine, an electric power accumulator that includes a current sensor and a voltage sensor, a DC bus, an inverter that is connected to the step-up and step-down transformer and the electric power accumulator via the DC bus for driving the generator using electric power from the electric power accumulator, and a control apparatus that measures an internal resistance of the electric power accumulator, wherein the control apparatus comprises:

a pattern generating part configured to generate an internal resistance measurement pattern in a non-operation status in which there is no operation for the hybrid-type construction machine from an operator; and a changing part configured to change an output of the generator based on the pattern generated in the pattern generating part such that a state of the electric power accumulator changes from a state where the electric power accumulator is not substantially charged or discharged to a state where the electric power accumulator is charged or discharged;

wherein the control apparatus is configured to measure the internal resistance of the electric power accumulator based on detected values of electric current values and detected values of voltage values before and after a change of the output of the generator that causes the step-up and step-down transformer to change the state of the electric power accumulator.

13. The hybrid-type construction machine of claim 12, wherein the internal resistance measurement pattern generated in the pattern generating part is an instruction pattern for the generator, and the detected values of electric current values and the detected values of voltage values before and after a change of the output of the generator correspond to the detected values of electric current values and the detected values of voltage values before and after a change in the instruction pattern.

14. The hybrid-type construction machine of claim 12, wherein the internal resistance measurement pattern generated in the pattern generating part is a target value pattern of SOC State Of Charge) of the electric power accumulator, and the detected values of electric current values and the detected values of voltage values before and after a change of the output of the generator correspond to the detected values of electric current values and the detected values of voltage values before and after a change in the target value pattern of SOC.

15. The hybrid-type construction machine of claim 12, wherein the generator is a regenerative generator.

16. The control apparatus of claim 13, wherein the pattern generating part generates the internal resistance measurement pattern when an engine rpm is greater than a predetermined value in the non-operation status.

17. The control apparatus of claim 14, wherein the pattern generating part generates the internal resistance measurement pattern when an engine rpm is greater than a predetermined value in the non-operation status.

* * * * *